US006373414B2

United States Patent
Koga et al.

(10) Patent No.: US 6,373,414 B2
(45) Date of Patent: Apr. 16, 2002

(54) SERIAL/PARALLEL CONVERTER

(75) Inventors: Makoto Koga; Yoshinori Okajima, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/947,503

(22) Filed: Sep. 7, 2001

Related U.S. Application Data

(62) Division of application No. 09/583,232, filed on May 31, 2000, which is a division of application No. 09/063,790, filed on Apr. 22, 1998, now Pat. No. 6,097,323.

(30) Foreign Application Priority Data

May 21, 1997 (JP) .............................. 9-131477
Aug. 10, 1997 (JP) .............................. 9-275539

(51) Int. Cl.[7] .............................................. H03M 9/00
(52) U.S. Cl. ....................................... 341/100; 341/101
(58) Field of Search ................................ 341/100, 101, 341/143; 364/44, 27, 44.34; 327/201

(56) References Cited

U.S. PATENT DOCUMENTS

| 4,393,301 | A | 7/1983 | Svendsen |
| 5,541,596 | A | 7/1996 | Yoshida |
| 5,561,423 | A | 10/1996 | Morisaki |
| 5,721,545 | A | 2/1998 | Poplevine |
| 5,805,088 | A | 9/1998 | Butler et al. |
| 5,926,129 | A | 7/1999 | Ephgrave et al. |
| 6,018,260 | A | * 1/2000 | Gabara ........................ 327/201 |
| 6,198,415 | B1 | * 3/2001 | Yoshikawa et al. ......... 341/100 |

FOREIGN PATENT DOCUMENTS

| JP | 59-108421 | 6/1984 |
| JP | 2-237240 | 9/1990 |

* cited by examiner

*Primary Examiner*—Patrick Wamsley
(74) *Attorney, Agent, or Firm*—Arent Fox Kintner Plotkin & Kahn, PLLC

(57) ABSTRACT

According to the present invention, a serial/parallel converter, which outputs, with the same phase and in parallel, a plurality of data sets input serially in synchronization with an input clock, comprises: at least two input latch flip-flops for latching the plurality of input data sets in synchronization with the input clock; a pulse generator for generating a plurality of latch clocks synchronously with timings at which the plurality of data sets are held by the input latch flip-flops; a plurality of holding flip-flops for latching in order the plurality of data sets held by the input latch flip-flops in accordance with the plurality of latch clocks; and a plurality of output latch flip-flops for, in accordance with the last latch clock synchronous with when the last data set of the plurality of data sets is held by the input latch flip-flops, latching in parallel the plurality of data sets held by the holding flip-flops and the last data set by the input latch flip-flops.

5 Claims, 32 Drawing Sheets

SECOND EMBODIMENT

FIRST EMBODIMENT

SECOND EMBODIMENT

THIRD EMBODIMENT

FOURTH EMBODIMENT

TIMING CHART OF FIG.16

MODIFICATION OF FOURTH EMBODIMENT

MODIFICATION OF FOURTH EMBODIMENT

FIFTH EMBODIMENT

SIXTH EMBODIMENT

SEVENTH EMBODIMENT

EIGHTH EMBODIMENT

NINTH EMBODIMENT

SERIAL/PARALLEL CONVERTER

This application is a divisional application filed under 37 CFR § 1.53(b) of parent application Ser. No. 09/583,232, filed May 31, 2000, which is a divisional application of Ser. No. 09/063,790, filed Apr. 22,1998, now U.S. Pat. No. 6,097,323.

BACKGROUND OF THE INVENTION

1. Field of the Invention

The present invention relates to a serial/parallel converter that enables fast processing with low current consumption.

2. Related Arts

A serial/parallel converter is frequently employed in an integrated semiconductor circuit. Such a serial/parallel converter is, for example, one by which a plurality of serially input address signals from a system are output in parallel internally. This converter is employed for a system having an extremely high transfer rate, such as 800 Mbps or 1.6 Gbps, and a plurality of address signals are transmitted at an extremely high transfer rate. It is, therefore, necessary for the internal serial/parallel converter to latch, in a short period of time, address signals which are input at high speed and to output them in parallel with the same phase.

FIG. 35 is a diagram illustrating a conventional serial/parallel converter. FIG. 36 is a timing chart for the serial/parallel converter in FIG. 35. In this example circuit, a clock CLK is amplified by a clock amplifier C36 and an internal clock S55 is generated. The internal clock S55 is divided by 4 by a frequency divider C45, and a clock S64 for final latching is generated. Input data DATA is amplified by a data amplifier C37, and is transferred to corresponding flip-flop circuits C38 through C44 at the leading edges or trailing edges of the internal clock S55. That is, the flip-clop circuits C38, C39, C40 and C41 latch the input data DATA at the leading edges of the internal clock S55, while the flip-flops C42, C43 and C44 latch the input data DATA at the trailing edges of the internal clock S55.

As is shown in FIG. 36, the data DATA is transmitted synchronously with the leading edges of the clock CLK (internal clock S55), and is synchronously latched by the flip-flops with the leading edges and the trailing edges of the internal clock S55. In this example circuit, at time T1, where data Dn, Dn+1, Dn+2 and Dn+3 are latched by the corresponding flip-flops C38, C39, C40 and C41, these data are latched by the flip-flops C46, C47, C48 and C49 at the leading edge of a final latch clock S64. During a period equivalent to four times the cycle of the clock CLK, the flip-flops C46 through C49 latch the data and output in parallel a set of four data (S65~S68) to four output terminals S65 through S68.

As is described above, the conventional serial/parallel converter converts four serial data sets into four parallel data sets in synchronization with the leading edge of the ¼ frequency divided clock S64.

The above serial/parallel converter requires eleven flip-flop circuits for 4-bit serial/parallel conversion. In addition, since the flip-flops C38 through C44 perform data latching four times and the flip-flops C46 through C49 perform data latching one time, a total of 32 operations by the flip-flops are required for one conversion process, and the current consumption is increased. According to this, for the conversion of 8-bit serial data, the number of required flip-flop circuits and the number of operations will be increased and the current consumption will be also increased.

Further, when the frequency of the input clock is increased, the operation speed of the flip-flop that performs synchronous latching with the input clock has to correspond to that speed. Thus, the circuit must be so designed that it can be operated at a high speed with a higher current consumption. Therefore, when a large number of flip-flops are operated for one serial/parallel conversion, the current consumption will be further increased. In addition, for faster processing, a serial/parallel converter is required that can cope with the input of data synchronized with the leading edge and the trailing edge of the input clock.

The serial input data is supplied in synchronous with a flag signal indicating the head of the serial data, therefore it is required that a fetching of the serial input data should be initiated using the flag signal as a trigger, and a parallel data output should be output at a certain timing signal. However, it is not easy to generate the timing signal for parallel data output after the last serial data has been fetched. Especially difficult, while taking into account an operating delay time for a flip-flop circuit for fetching the last serial data, is generating a timing signal for parallel data output at the shortest timing.

In addition, a circuit is required which generates a control clock for fetching serial data using an externally supplied flag signal as a trigger. Since this circuit has its own operating delay time, the input of serial data synchronized with a fast clock is affected accordingly. Therefore, a circuit is required which can fetch serial data without being affected by the timing of a flag signal.

SUMMARY OF THE INVENTION

It is, therefore, one object of the present invention to provide a circuit which requires a smaller number of flip-flops and which performs serial/parallel conversion by using a smaller number of latch operations.

It is another object of the present invention to provide a serial/parallel converter which can even latch serial data synchronously with a faster input clock, and which consumes only a small amount of current.

It is an additional object of the present invention to provide a serial/parallel converter which can provide an optimal relationship between the timings for the termination of a serial data fetch process and the output of parallel data.

It is a further object of the present invention to provide a serial/parallel converter which can synchronize the fetching of serial data with a clock without being affected by the timing of a flag signal indicating the head of serial data.

To achieve the above objects, according to one aspect of the present invention, a serial/parallel converter, outputting, with the same phase and in parallel, a plurality of data which is input serially in synchronization with an input clock, comprises:

a pulse generator for generating a plurality of latch clocks synchronized respectively with input timings of the plurality of data;

a plurality of holding flip-flops for latching in order the plurality of data in response to the plurality of latch clocks; and a plurality of output latch flip-flops for, in response to the last latch clock synchronized with input of the last data of the plurality of data, latching, in parallel, the plurality of data held by the holding flip-flops and the last input data.

According to the present invention, the number of required flip-flops can be reduced, and each flip-flop need perform latching only once for a single serial/parallel conversion, so that the amount of current consumption is reduced.

Further, to achieve the above objects, according to the second aspect of the present invention, a serial/parallel converter, outputting, with the same phase and in parallel, a plurality of data which is input serially in synchronization with an input clock, comprises:

at least two input latch flip-flops for latching the plurality of input data in synchronization with the input clock;

a pulse generator for generating a plurality of latch clocks synchronized with timings at which the plurality of data are held by the input latch flip-flops;

a plurality of holding flip-flips for latching in order the plurality of data held by the input latch flip-flops in response to the plurality of latch clocks; and a plurality of output latch flip-flops for, in response to the last latch clock synchronized with the latching of the last data of the plurality of data to the input latch flip-flops, latching, in parallel, the plurality of data held by the holding flip-flops and the last data held by the input latch flip-flops.

In the above circuit, when the input latch flip-flops have a first latching speed and the holding flip-flops have a second latching speed lower than the first latching speed, the serial data transferred at high speed can be latched, and the total amount of current consumption can be reduced. The above circuit also needs only a small number of flip-flops and the amount of current consumption is small as the first invention.

To achieve the above objects, according to a third aspect of the present invention, a serial/parallel converter for converting N bits (N is a plural) of serial data, which are supplied in synchronization with a clock from a timing of a flag signal, into parallel data comprising:

a pulse generator for serially generating first to Nth timing pulses in synchronization with the clock;

a flag signal latch circuit for latching said flag signal in response to said first timing pulse and for outputting a strobe signal corresponding to said flag signal in response to said Nth timing pulse;

a first-stage latch circuit for latching first to (N−1)th serial data in response to said first to (N−1)th timing pulses;

a second-stage latch circuit for latching, in response to said Nth timing pulse, the serial data latched by said first-stage latch circuit as well as an Nth serial data; and final-stage gate circuit for outputting in parallel N bits serial data latched by said second-stage latch circuit in response to said strobe signal.

According to the present invention, since the strobe signal is output in parallel to the latching of the serial data in the serial/parallel converter, the strobe signal can be generated at an optimal timing.

Also, to achieve the above objects, according to a fourth aspect of the present invention, a serial/parallel converter for converting N bits- (N is a plural) of serial data, which are supplied in synchronization with a clock from a timing of a flag signal, into parallel data comprising:

a pulse generator for generating first to Nth timing pulses serially in synchronization with a clock;

a flag signal latch circuit for latching said flag signal in response to said first timing pulse and for outputting a strobe signal corresponding to said flag signal in response to said Nth timing pulse;

a first-stage latch circuit for latching a (2M−1)th serial data in response to a (2M−1)th (M are all integers of $1 \leq M \leq N/2$) timing pulse;

a second-stage latch circuit for latching, in response to 2Mth timing pulse, said (2M=1)th serial data latched by said first-stage latch circuit as well as 2Mth serial data; and final-stage gate circuit for outputting in parallel N bits of serial data latched by said second-stage latch circuit in response to said strobe signal.

According to this aspect, the strobe signal can be generated at an optimal timing.

In addition, to achieve the above objects, according to a fifth aspect of the present invention, a serial/parallel converter for converting N bits (N is a plural) of serial data, which are supplied in synchronization with a clock from a timing of a flag signal, into parallel data comprises:

a pulse generator for repeatedly generating first to Nth timing pulses serially in synchronization with a clock;

a flag signal latch circuit for latching said flag signal in response to a (2I−1)th (I are all integers of $1 \leq I \leq N/2$) timing pulse and for outputting first to (N/2)th strobe signals corresponding to said flag signal in response to a (2I−2)th (or Nth if I=1) timing pulse;

a first-stage latch circuit for latching first to Nth serial data in response to said first to Nth timing pulses;

N/2 groups of second-stage latch circuits for respectively latching, in response to a (2I−2)th timing pulse, (2I−1)th to (2I−3)th ((N−1)th if I=1) serial data latched by said first-stage latch circuit; and N/2 groups of final-stage gate circuits for respectively outputting in parallel, in response to said first to said (N/2)th strobe signals, (N−1) bits of serial data latched by said second-stage latch circuits as well as Nth serial data latched by said first latch circuit.

According to the fifth aspect, when the leading edge of a clock corresponds to the flag signal, appropriate serial data can be latched and output regardless of which leading edge of the clock it is at which the flag signal is supplied.

Furthermore, according to sixth aspect of the present invention a serial/parallel converter for converting N bits (N is a plural) of serial data, which are supplied in synchronization with a clock from a timing of a flag signal, into parallel data comprising:

a pulse generator for repeatedly generating first to Nth timing pulses serially in synchronization with a clock;

a flag signal latch circuit for latching said flag signal in response to an Ith (I are all integers of $1 \leq I \leq N$) timing pulse and for outputting first to Nth strobe signals corresponding to said flag signal in response to an (I−1)th (or Nth if I=1) timing pulse;

a first-stage latch circuit for latching first to Nth serial data in response to said first to Nth timing pulses;

N groups of second-stage latch circuits for respectively latching, in response to said Ith timing pulse, Ith to (I−2)th ((N−1)th if I=1 and Nth if I=2) serial data latched by said first-stage latch circuit; and N groups of final-stage gate circuits for outputting in parallel, in response to said first to said Nth strobe signals, (N−1) bits of serial data latched by said second-stage latch circuits as well as Nth serial data latched by said first latch circuit.

According to the sixth aspect, regardless of whether a flag signal is supplied at a leading edge of a clock or at a trailing edge, all the available sets of serial data can be latched and appropriate serial data can be output.

Moreover, according to a seventh aspect of the present invention, a serial/parallel converter for converting N bits (N is a plural) of serial data, which are supplied in synchronization with a clock from a timing of a flag signal, into parallel data comprising:

a pulse generator for repeatedly generating first to Nth timing pulses serially in synchronization with a clock;

a flag signal latch circuit for latching said flag signal in response to a (2M−1)th (M are all integers of $1 \leq M \leq N/2$) timing pulse and for outputting-first to (N/2)th strobe signals corresponding to said flag signal in response to a (2M−2)th (or Nth if M=1) timing pulse;

a first-stage latch circuit for latching a (2M−1)th serial data in response to said (2M−1)th (M is an integer of $1 \leq M \leq N/2$) timing pulse;

a second-stage latch circuit for latching, in response to a 2Mth timing pulse, said (2M−1)th serial data latched by said first-stage latch circuit as well as a 2Mth serial data; and N/2 groups of final-stage gate circuits for outputting in parallel, in response to said first to said (N/2)th strobe signals, N bits of serial data latched by said second-stage latch circuit.

According to the seventh aspect, when the leading edge of a clock corresponds to the flag signal, appropriate serial data can be latched and output regardless of which leading edge of the clock it is at which the flag signal is supplied.

To achieve the above objects, according to an eighth aspect of the present invention, a serial/parallel converter for converting N bits (N is a plural) of serial data, which are supplied in synchronization with a clock from a timing of a flag signal, into parallel data comprising:

a pulse generator for repeatedly generating first to Nth timing pulses serially in synchronization with a clock;

a flag signal latch circuit for latching said flag signal in response to an Mth (M are all integers of $1 \leq M \leq N$) timing pulse and for outputting first to Nth strobe signals corresponding to said flag signal in response to a (M−1)th (or Nth if M=1) timing pulse;

first-stage latch circuits for respectively latching an Mth serial data in response to said Mth (M are all integers of $1 \leq M \leq N$) timing pulse;

a second-stage latch circuit for latching, in response to an (M+1)th (first if M=N) timing pulse, said Mth serial data latched by said first-stage latch circuit; and N groups of final-stage gate circuits for outputting in parallel, in response to said first to said Nth strobe signals, N bits of serial data latched by said first-stage and said second-stage latch circuits.

According to the eighth aspect, regardless of whether a flag signal is supplied at a leading edge of a clock or at a trailing edge, all the available sets of serial data can be latched and appropriate serial data can be output.

DETAILED DESCRIPTION OF THE PREFERRED EMBODIMENTS

The preferred embodiments of the present invention will now be described while referring to the accompanying drawings. These embodiments, however, do not limit the technical scope of the present invention.

In the description of the following embodiments, a flip-flop is employed as a latch circuit and a flip-flop or NAND gate is employed as gate means.

Figure 1:
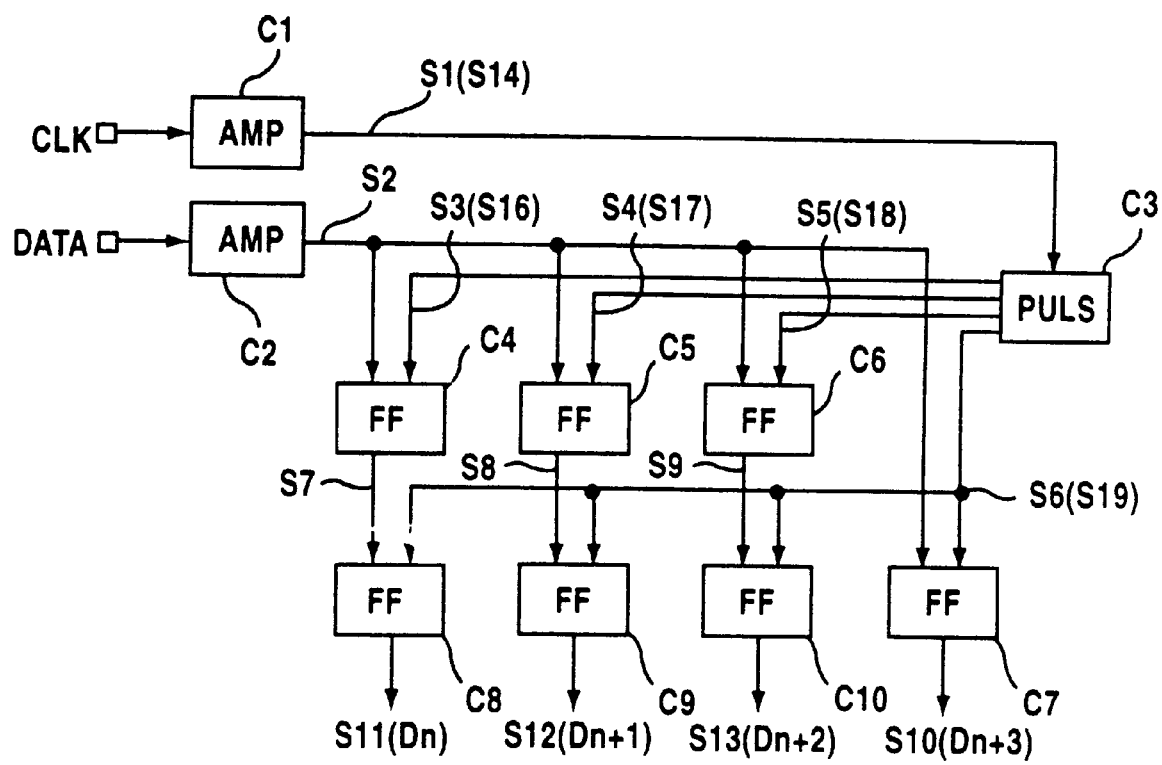
FIG. 1 is a diagram illustrating a serial/parallel converter according to a first embodiment of the present invention.
Figure 35:
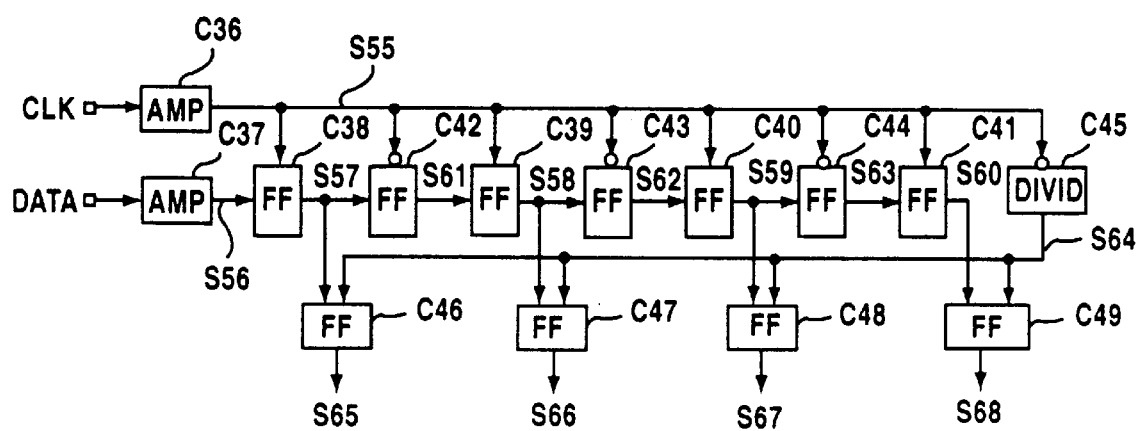
FIG. 35 is a diagram illustrating a common, conventional serial/parallel converter.
Figure 36:
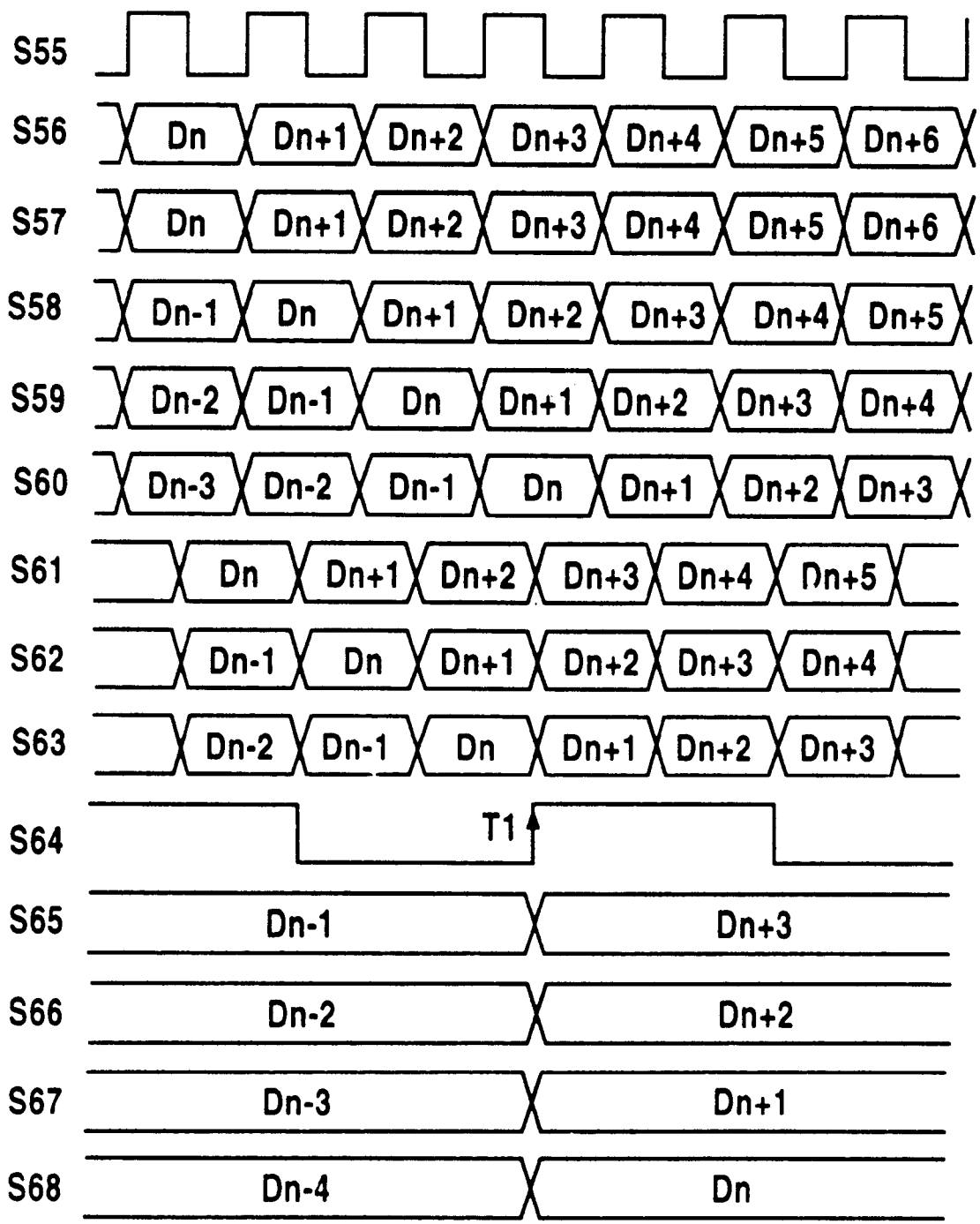
FIG. 36 is a timing chart showing the operation of the serial/parallel converter in FIG. 35.

FIG. 1 is a diagram illustrating a serial/parallel converter according to a first embodiment of the present invention. This example circuit is constituted by a smaller number of flip-flops than those for the prior art in FIG. 35. A fast input clock CLK is amplified by an amplifier C1, and an internal clock S1 is generated. Data DATA to be supplied serially is amplified by an amplifier C2 and internal data S2 is produced. In a pulse generator C3 to which the internal clock S1 is supplied, latch clocks S3 through S6 for flip-flops C4 to C10 are generated.

Figure 2:
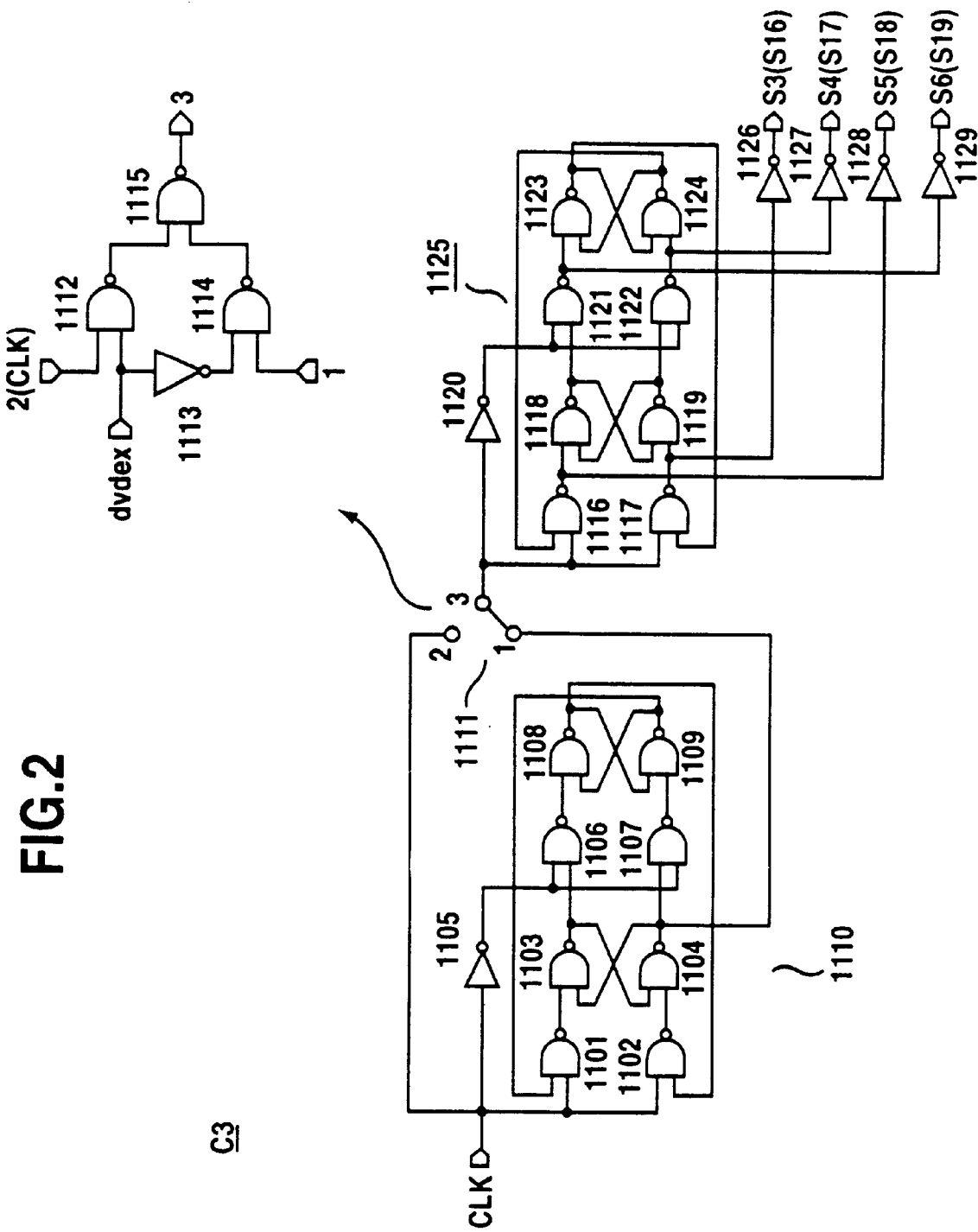
FIG. 2 is a circuit diagram illustrating an example of a pulse generator C3 in the serial/parallel converter in FIG. 1.

FIG. 2 is a specific circuit diagram illustrating the pulse generator C3 of the serial/parallel converter in FIG. 1. The pulse generator C3 comprises a first frequency divider 1110, including NAND gates 1101 to 1109 and an inverter 1105, and a second frequency divider 1125, including NAND gates 1116 to 1124 and inverters 1120 and 1126 to 1129. A switch 1111 located between the frequency dividers 1110 and 1125 is constituted by NAND gates 1112, 1114 and 1115 and an inverter 1113, as is shown in FIG. 2.

The operation of the switch 1111 is as follows. When a signal dvdex is at level H, the clock CLK is input via the NAND gates 1112 and 1115 directly to the second frequency divider 1125. Since the input from the inverter 1113 to the NAND gate 1114 is at level L, the NAND 1114 does not transmit to the second frequency divider 1125 a signal received from the first frequency divider 1110. This operation occurs in a case where data DATA is provided at both the leading (rising) and trailing (falling) edges of the clock CLK. On the contrary, when signal dvdex is at level L, the output of the first frequency divider 1110 is transmitted via the NAND gates 1114 and 1115 to the second frequency divider 1125. This operation occurs in a case where the data DATA is provided only at the leading (rising) edge of the clock CLK.

Figure 3:
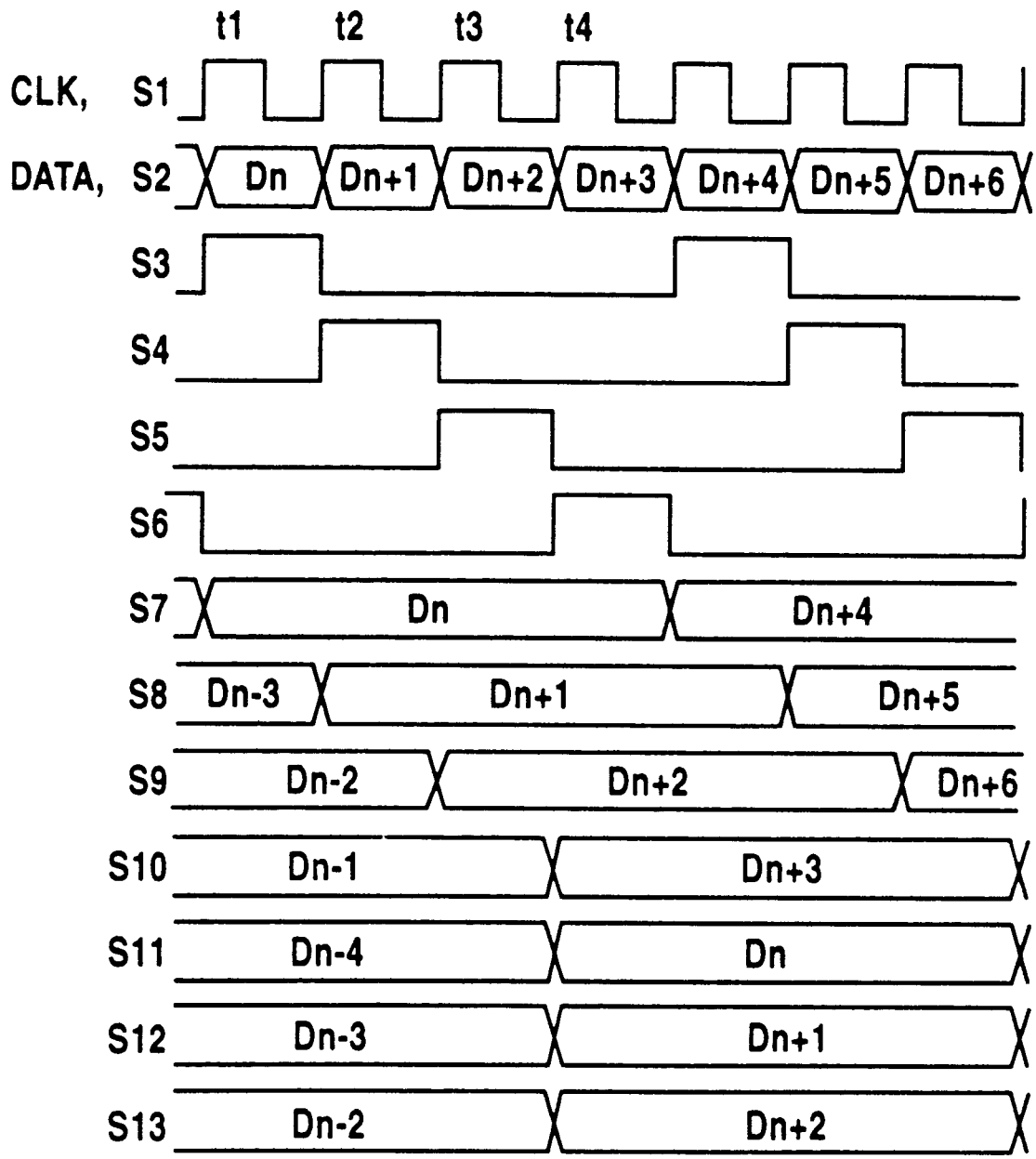
FIG. 3 is a timing chart showing the operation of the serial/parallel converter in FIG. 1.
Figure 4:
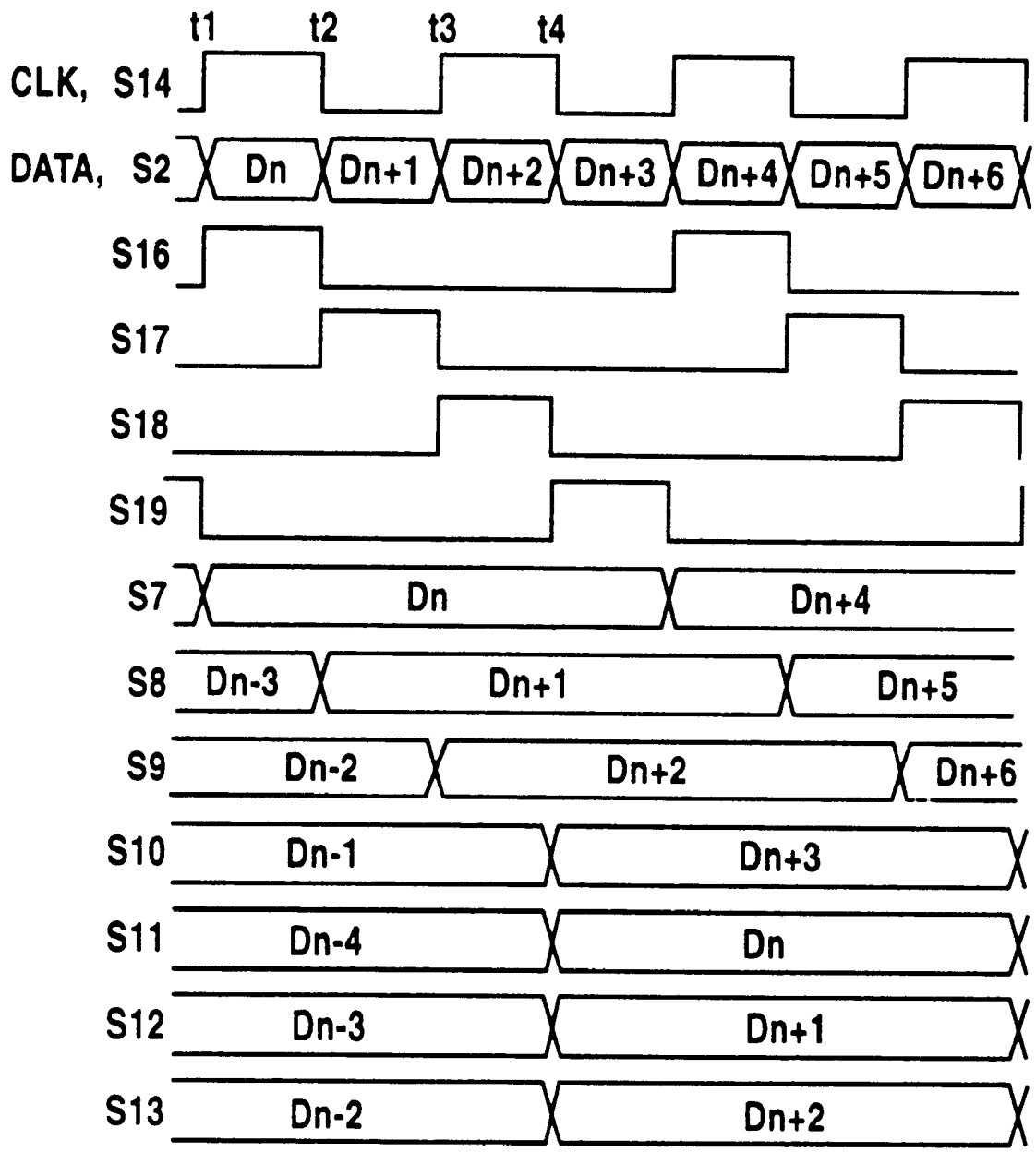
FIG. 4 is a timing chart showing the operation of the serial/parallel converter in FIG. 1.

FIGS. 3 and 4 are timing charts showing the operation of the serial/parallel converter in FIG. 1. The example shown in FIG. 3 is for a case where the data DATA is transmitted serially at the leading edge of the input clock CLK. The example shown in FIG. 4 is for a case where the data DATA is transmitted serially at both the leading and trailing edges of the input clock CLK. The operations in FIGS. 3 and 4 are switched from one to the other by the switch 111 in FIG. 2.

First, while referring to FIG. 3, an explanation will be given for an operation performed when the data DATA is provided serially at the leading edge of the input clock CLK. The length of the serial data is four bits, as an example. Therefore, data Dn, Dn+1, Dn+2 and Dn+3 are input at the leading edges of the internal clock S1, obtained by amplifying the input clock CLK. Latch clocks S3, S4 and S5 are generated by the pulse generator C3, as is shown in FIG. 3, and the data Dn, Dn+1 and Dn+2 are latched by corresponding holding flip-flops C4, C5 and C6. The latch clocks S3, S4 and S5 are synchronized with the timing at which the data Dn, Dn+1 and Dn+2 are input, and each have a pulse length approximately equivalent to an effective interval.

Synchronized with the timing when, the final data Dn+3 is input, the last latch clock S6 is transmitted, and the data Dn+3 is latched by the output latch flip-flop C7, while the data Dn, Dn+1 and Dn+2, which are latched by the holding flip-flops C4, C5 and C6, are latched respectively by the output latch flip-flops C8, C9 and C10. As a result, the data Dn, Dn+1, Dn+2 and Dn+3 are output in parallel, and with the same phase, by the output latch flip-flops C8, C9, C10 and C7.

In the pulse generator C3 shown in FIG. 2, the control signal dvdex is set to level L and the two frequency dividers 1110 and 1125 are coupled together. In the frequency divider 1110, the outputs of the NAND gates 1103 and 1104 are changed, as inverted pulses, at the leading edge of the internal clock S1, and the outputs of the NAND gates 1108 and 1109 are changed, as inverted pulses, at the next leading edge of the internal clock S1. Therefore, the outputs of the NAND gates 1103 and 1104 are clocks obtained by dividing the internal clock S1 by two.

The internal clock S1 is divided by two by the frequency divider 1110, and the divided signal is transmitted via nodes 1 and 3 of the switch 1111 to the frequency divider 1125. The leading edge of the internal clock S1 is transmitted via the NAND gates 101 through 104 and 116 or 117 to the output terminal S3, and the latch clock S3 is generated and is output in synchronous with the leading edge of the internal clock S1 at time t1. The length of the pulse S3 is adjusted by the frequency divider 1110 so that it is equal to the length of one cycle of the internal clock S1. Similarly, the latch clock S4 is output in synchronous with the succeeding leading edge of the internal clock S1 at time t2, and its pulse width is also equal to the length of one cycle of the internal clock S1.

A latch clock S5 rises in synchronous with the leading edge of the internal clock S1 at time t3, and a latch clock S6 rises in synchronous with the leading edge of the internal clock S1 at time t4. Each of their pulse widths is equal to the length of one cycle of the internal clock S1.

FIG. 4 is a timing chart when input data DATA changes at the leading edges and trailing edges of the input clock CLK. In the pulse generator C3 shown in FIG. 2, the nodes 2 and 3 of the switch 1111 are connected together by setting control signal dvdex to level H. An internal clock S14 is transmitted unchanged to the frequency divider 1125 at the following stage, and latch clocks S16 to S19 rise at times t1, t2, t3 and t4, as is shown in FIG. 4. At time t4, where the final data Dn+3 is input, and in response to the latch clock S19, the final data Dn+3 is latched by the output latch flip-flop C7, and the data Dn, Dn+1 and Dn+2 are latched by the respective output latch flip-flops C8, C9 and CIO.

Therefore, by using the control signal dvdex, the serial/parallel converter shown in FIGS. 1 and 2 can handle serial data, regardless of whether they are synchronously input with the leading edge of the input clock CLK or with both the leading edge and the trailing edge of the input clock CLK. The most important thing is that since only seven flip-flops are employed to enable conversion of 4-bit serial data to parallel data, this converter can be designed to operate with a smaller number of flip-flop circuits than the conventional converter in FIG. 14. In addition, as each flip-flop performs a latch operation only once for serial/parallel conversion, accordingly, the amount of current consumption is reduced.

Figure 5:
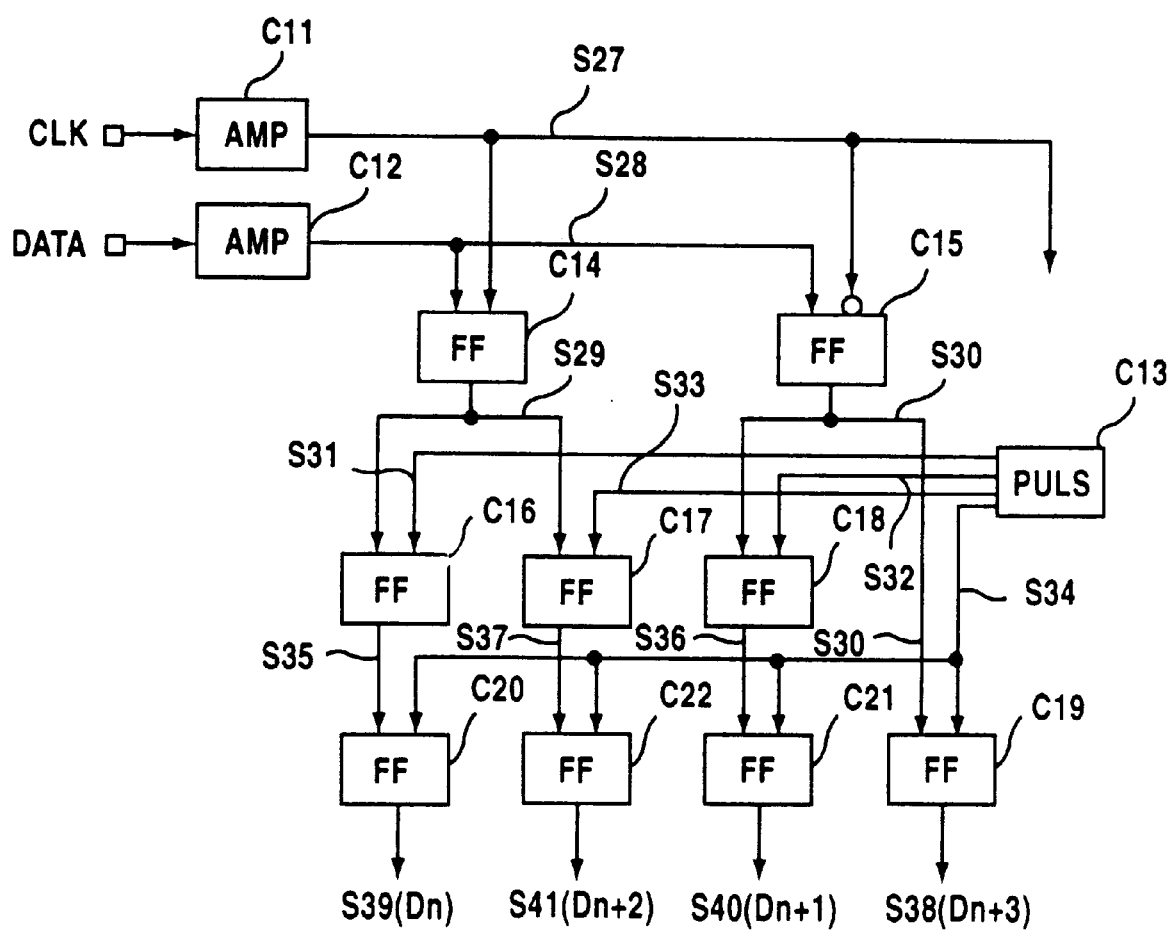
FIG. 5 is a diagram illustrating a serial/parallel converter according to a second embodiment of the present invention.

FIG. 5 is a diagram illustrating a serial/parallel converter according to a second embodiment of the present invention. In this embodiment, the serial/parallel converter comprises nine flip-flops: input latch flip-flops C14 and C15, which can perform a comparatively fast latch operation, and flip-flops C16 to C19, which perform a slower latch operation than the flip-flops C14 and C15. A pulse generator C13 generates latch clocks S31 to S34 in synchronization with an internal clock S27, which is produced by amplifying to an input clock CLK in an amplifier C11. These latch clocks S31 to S34 are synchronized with the timings at which the input latch flip-flops C14 and C15 latch four data sets.

Figure 6:
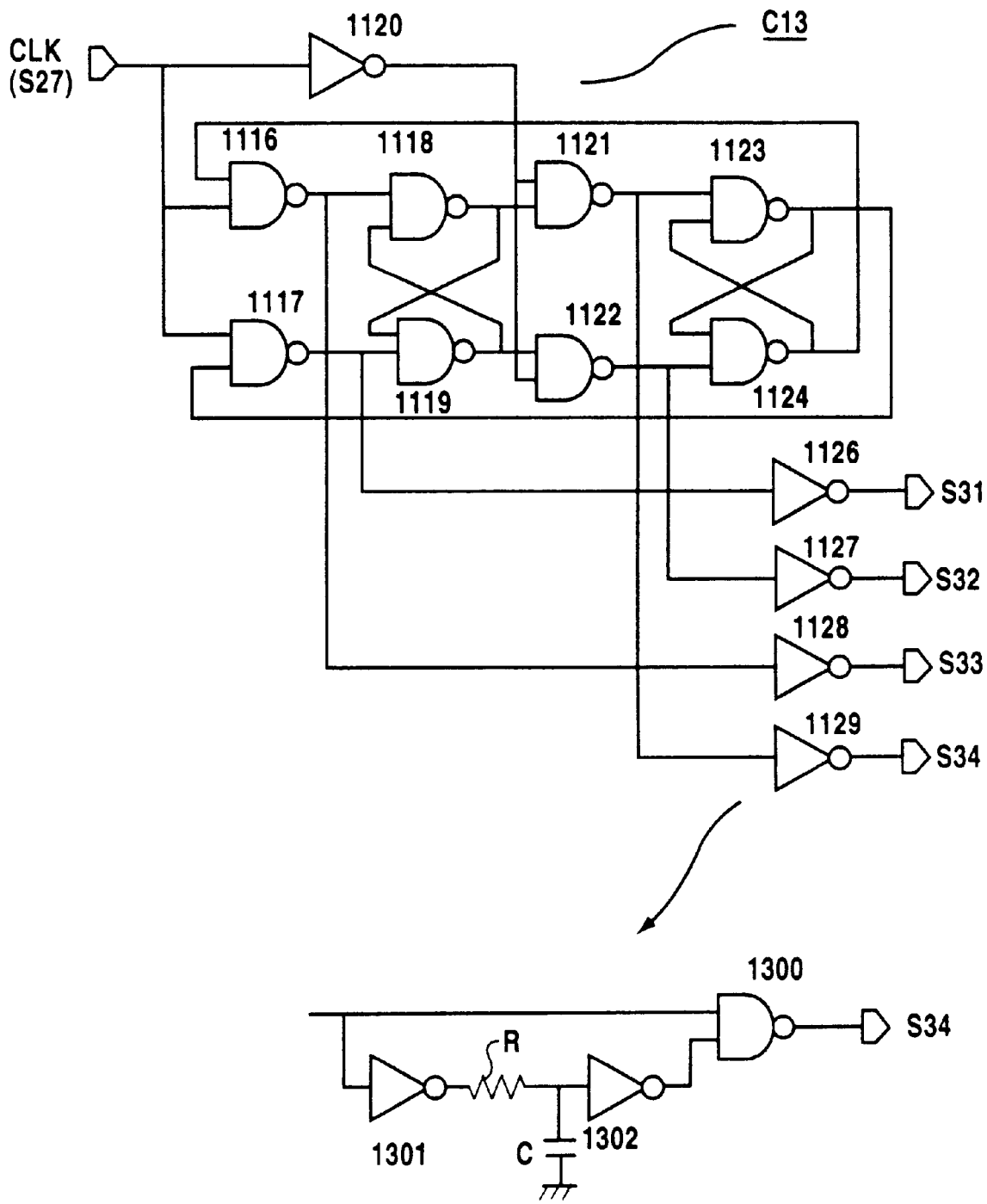
FIG. 6 is a detailed circuit diagram illustrating a pulse generator C13 in FIG. 5.
Figure 7:
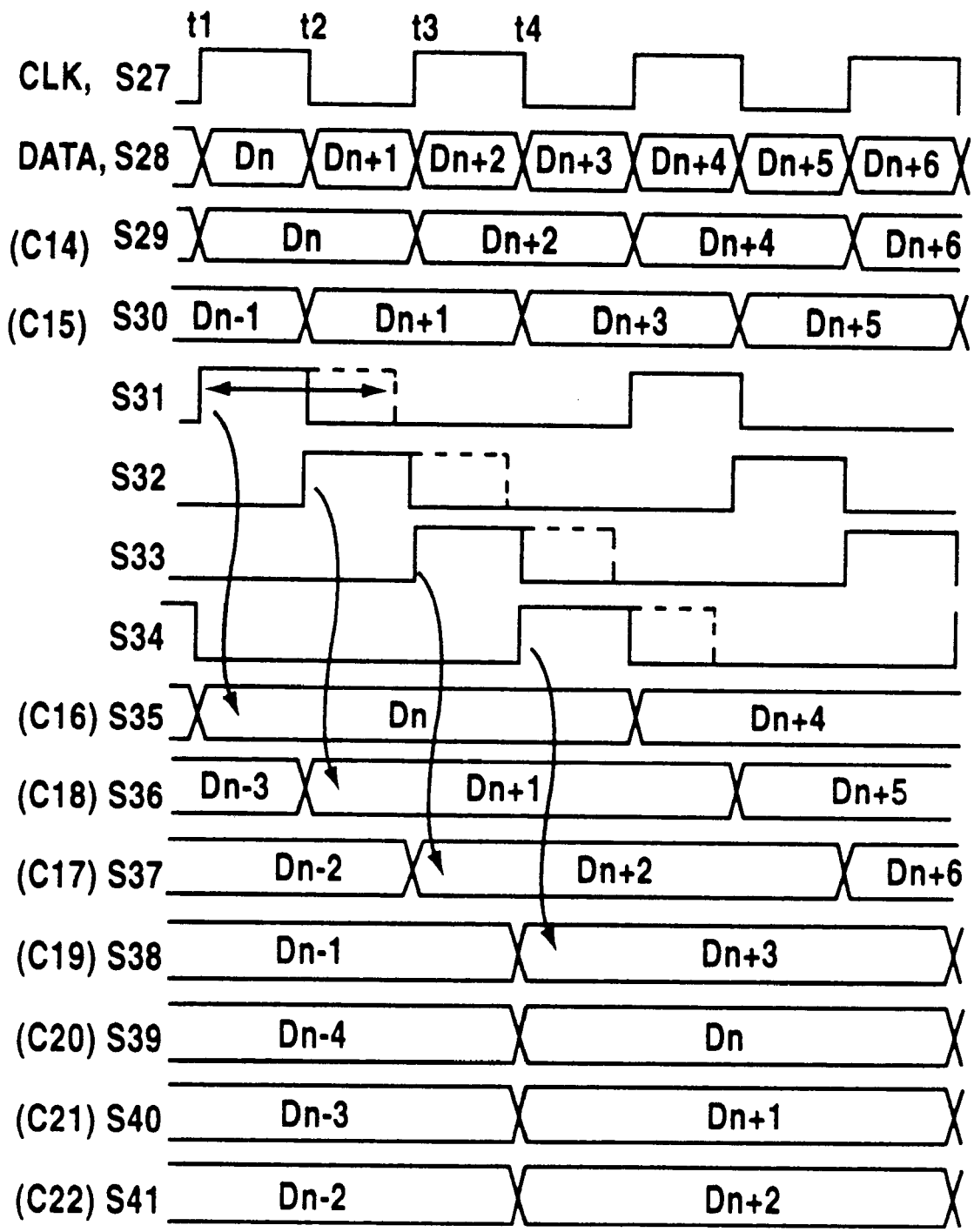
FIG. 7 is a timing chart showing the operation of the serial/parallel converter in FIG. 5.

FIG. 6 is a detailed circuit diagram illustrating the pulse generator C13 in FIG. 5, and FIG. 7 is a timing chart showing the operation of the serial/parallel converter in FIGS. 5 and 6. In this embodiment, the serial data have a length of four bits.

The pulse generator C13 is constituted by circuits for dividing the frequency of the internal clock. NAND gates 1116 to 1119 constitute a latch circuit at the first stage, and NAND gates 1121 to 1124 constitute a latch circuit at the succeeding stage. Since this circuit has the same arrangement as that of the second frequency divider 1125 of the pulse generator C3 in FIG. 2, the same reference numerals are used to denote corresponding gates. Also, in this circuit, the outputs of the NAND gates 1116 and 1117 change, as inverted pulses, in synchronization with the leading edge of the internal clock C27; and the outputs of the NAND gates 1121 and 1122 change, as inverted pulses, in synchronization with the trailing edge of the internal clock S27. Therefore, as is shown in FIG. 7, latch clocks S31 to S34 output via respective inverters 1126 to 1129 are pulse signals which synchronously rise with time t1 to t4.

The operation in FIG. 5 will now be described. In this example, the input clock CLK has a pulse width of 5 nsec, for example, and serial data DATA synchronously changes with the leading edge and the trailing edge of the input clock CLK. Therefore, the input latch, fast flip-flop C14 latches data Dn and Dn+2 at the leading edge of the internal clock S27 (time t1 and t3); and the input latch, fast flip-flop C15 latches data Dn+1 and Dn+3 at the trailing edge of the internal clock S27 (time t2 and t4). Thus, the flip-flop C15 performs a latch operation in response to the inverted logic of the internal clock S27. While a circular inversion symbol is placed at the input terminal of the internal clock S27 at the flip-flop C15 in FIG. 5, actually, a latch clock S27 is transmitted via an inverter (not shown) to the input terminal of C15.

The input latch flip-flops C14 and C15 are so designed that they can latch data in a period equivalent to the pulse width of the internal clock S27. When the pulse width of the internal clock S27 is very short, their latch operation must be performed at high speed. The structure of such fast flip-flop will be described later.

The pulse generator C13, which receives the internal clock S27, produces latch clocks C31, S32, S33 and S34, which are synchronized with the timings t1 to t4 for the leading edge and the trailing edge of the internal clock S27. In the pulse generator C13 in FIG. 6, first, the output of the NAND gate 1117 goes to level L, in accordance with the rise of the internal clock S27, to set the latch clock S31 at level H. The L-level output of the NAND gate 1117 is latched by a latch circuit constituted by the NAND gates 1118 and 1119. Then, in accordance with the fall of the internal clock S27, the output of the NAND gate 1122 goes to level L and the latch clock S32 goes to level H. Similarly, in accordance with the next rise of the internal clock S27, the latch clock S33 goes to level H, and in accordance with the following rise of the internal clock, the latch clock S34 goes to level H.

In response to the H-level latch clock S31, the holding flip-flop C16 latches the data Dn held in the input latch flip-flop C14; in response to the H-level latch clock S32, the holding flip-flop C18 latches the data Dn+1 held in the input latch flip-flop C15; and in response to the H-level latch clock S33, the holding flip-flop C17 latches the data Dn+2 held in the input latch flip-flop C14. At time t4, in response to the H-level latch clock S34, the output latch flip-flop C19 latches the data Dn+3 held in the input latch flip-flop C15, and the output latch flip-flops C20, C21 and C22 latch the data Dn, Dn+1 and Dn+2 held in the holding flip-flops C16, C17 and C18.

As is apparent from the above operation, since the input latch flip-flops C14 and C15 hold data during a period of one cycle of the internal clock S27, the holding flip-flops C16, C17, C18 and C19 do not need to perform high speed latch operations. Therefore, the pulse generator C13 can be changed to set a long pulse width for latch clocks S31 to S34, as is indicated by broken lines in FIG. 7. This alteration is possible by changing, for example, the inverters 1126 to 1129 in FIG. 6 to a circuit which includes a NAND gate 1300, a delay circuit having a resistor R and a capacitor C, and inverters 1301 and 1302, which are provided at the front and rear stages of the delay circuit R.C. When the latch operations of the holding flip-flops C16 to C19 can be performed at a low speed, this means that the amount of current required for this operation can be reduced. Similarly, the latch operations of the output latch flip-flops C20, C21 and C22 can be performed at a low speed.

As described above, the serial/parallel converter shown in FIG. 5 employs nine flip-flops; however, fast latch operations are required only for the input latch flip-flops C14 and C15, and the other flip-flops-need only perform comparatively slow operations. Therefore, the total amount of current consumption is smaller than that in the first embodiment in FIG. 1.

Figure 8:
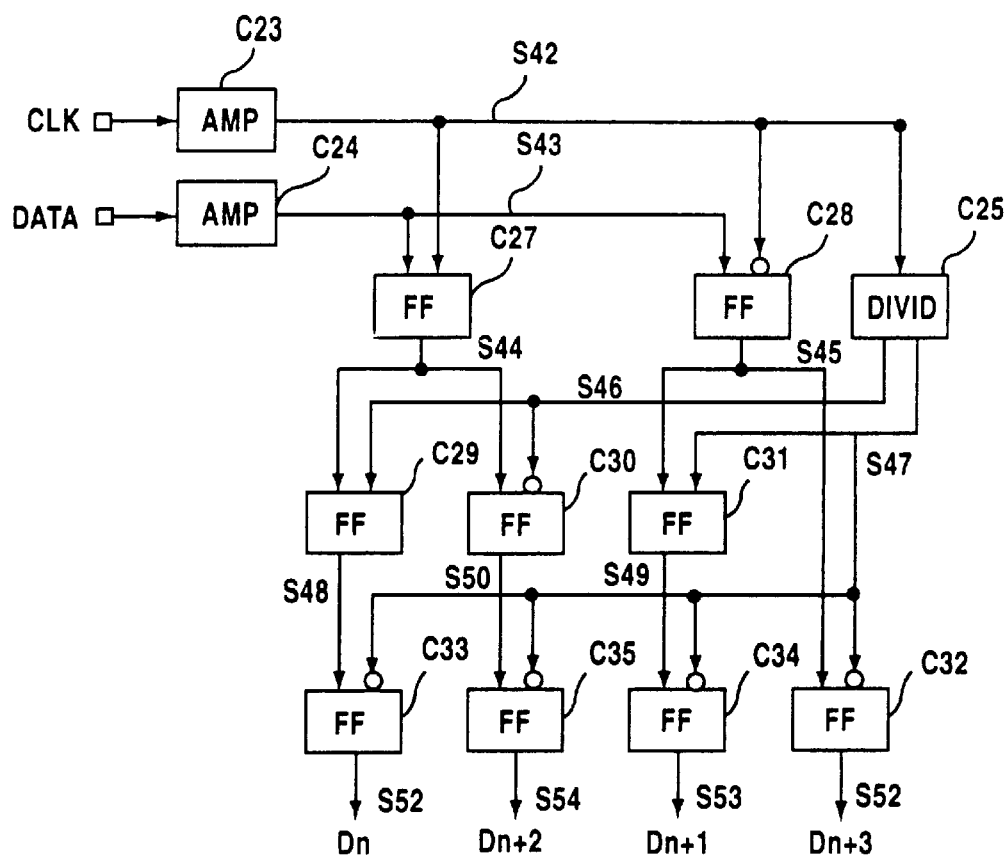
FIG. 8 is a diagram illustrating a serial/parallel converter according to a third embodiment of the present invention.
Figure 9:
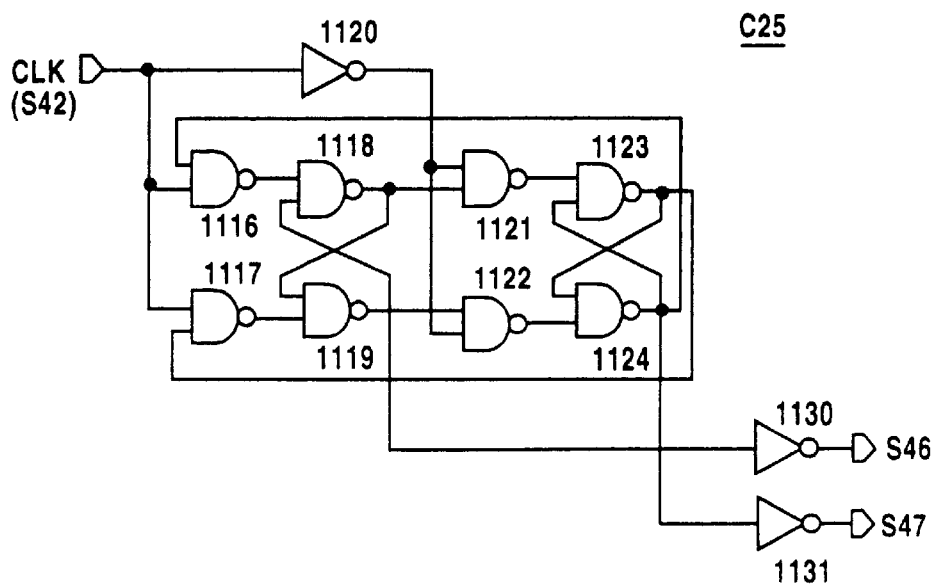
FIG. 9 is a circuit diagram illustrating a pulse generator C25 in FIG. 8.
Figure 10:
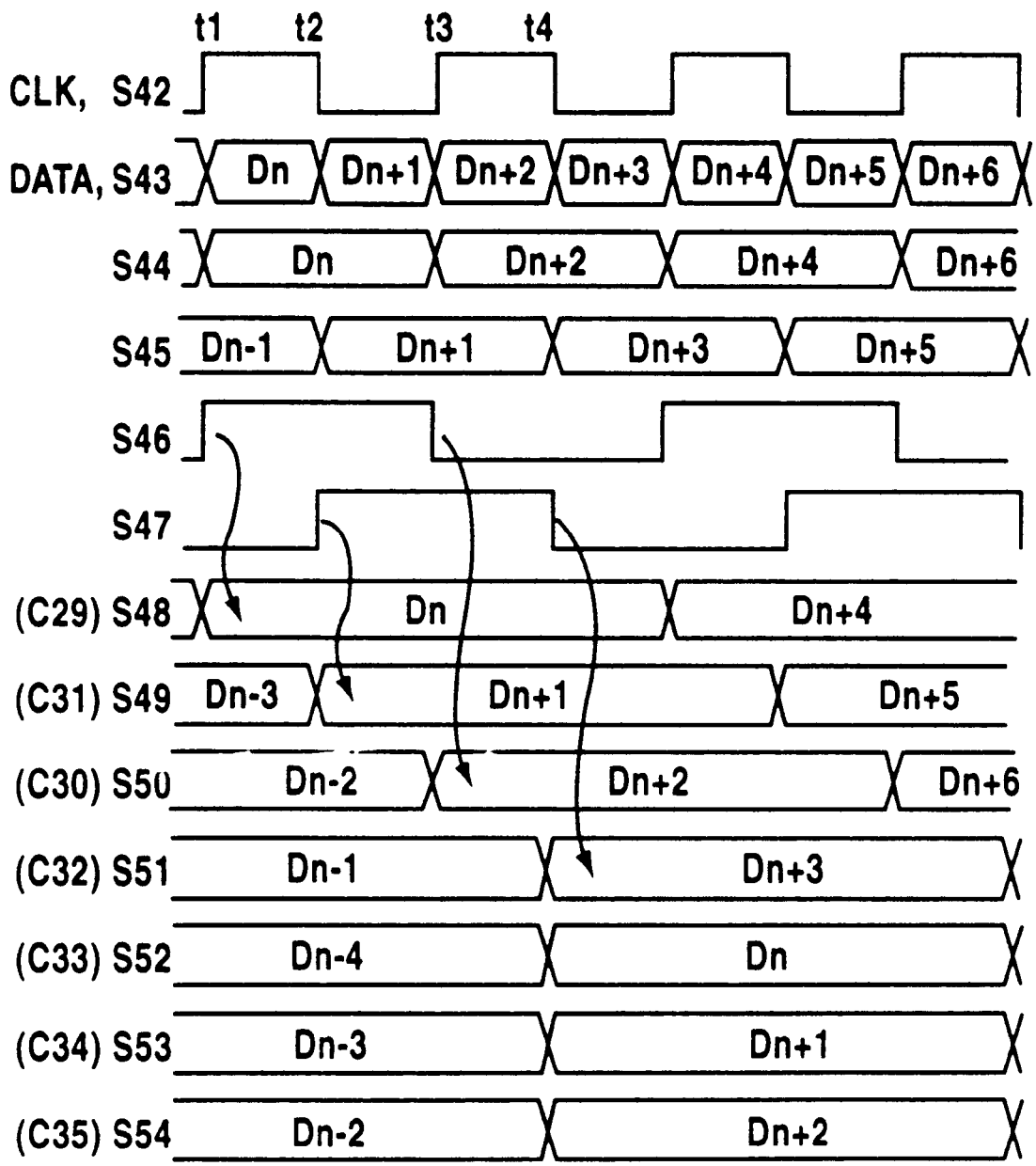
FIG. 10 is a timing chart showing the operation of the serial/parallel converter in FIG. 8.

FIG. 8 is a circuit diagram illustrating a third embodiment. FIG. 9 is a circuit diagram illustrating a pulse generator used for the third embodiment, and FIG. 10 is a timing chart showing the operation of the serial/parallel converter of the third embodiment. The serial/parallel converter in this embodiment has basically the same structure as the serial/parallel converter in FIG. 5. The serial/parallel converter comprises input latch flip-flops C27 and C28, which have a high processing speed, and holding flip-flops C29, C30 and C31 and output latch flip-flops C32 to C35, which have a comparatively low processing speed. The input latch flip-flips C27 and C28 alternately latch serially received data Dn, Dn+1, Dn+2 and Dn+3. The holding flip-flops C29, C30 and C31 latch corresponding data in response to the rise and the fall of latch clocks S46 and S47, which are generated by a pulse generator C25. Further, the output latch flip-flops C32, C33, C34 and C35 latch data Dn+3, Dn, Dn+1 and Dn+2 in response to the rise of the latch clock S47.

The difference in the circuit in FIG. 8 from the circuit shown in FIG. 5 is that the pulse generator C25 generates a lower frequency than that of the internal clock S42, i.e., a latch clock having a longer cycle. The flip-flops C30 and C32 to C35 perform a latch operation in response to corresponding L-level of the latch clocks (falling edge of the clocks) C46, C47. The pulse widths of the latch clocks C46 and C47 are longer than that of the internal clock S42, and the latch operations of the flip-flops C29 to C35 can be performed at a comparatively low speed. Since the flip-flops C30 and C32 to C35 perform latch operations at the L-level latch clock, a circular inversion symbol is placed at their input terminals to indicate that the phase of the latch clock is inverted. Actually, an inverter is inserted thereto.

The pulse generator C25 in FIG. 9 has the same arrangement as the circuit in FIG. 6, and the same reference numerals are used to denote corresponding components. The differences from the circuit in FIG. 6 are that the outputs of the NAND gates 1119 and 1124 are employed for respective latch clocks S46 and S47, and that the pulse widths are longer.

The serial/parallel converter in FIG. 8 employs nine flip-flops, a smaller number than are employed for the prior art. While one of the input latch flip-flops C27 and C28 requires a large amount of current in order to perform a fast latch operation, one of the other flip-flops can perform a latch operation at a low speed, and the amount of current consumption can be reduced.

Figure 11:
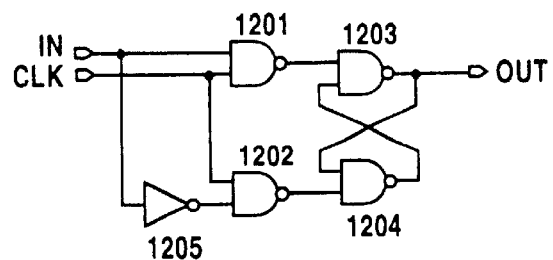
FIG. 11 is a circuit diagram illustrating a flip-flop for performing a slow latch operation.

FIG. 11 is a circuit diagram illustrating a flip-flop performing a slow latch operation. In this flip-flop, NAND gates 1203 and 1204 constitute a latch circuit, as in general, and NAND gates 1201 and 1202 perform gating for input IN upon receipt of a clock CLK. When, for example, the clock CLK goes to level H while the input IN is at level H, the inputs of the NAND gate 1201 go to level H, and the output goes to level L. In addition, the inputs of the NAND gate 1202 go to level H and level L, and the output goes to level H. In response to the L-level output of the NAND gate 1201, the output of the NAND gate 1203 goes to level H, and the inputs of the NAND gate 1204 go to level H and the output goes to level L. The latch operation is then completed. Therefore, for the latch operation, processing at a gate 1205, and at the NAND gates 1201 and 1202, and 1203 and 1204 must be completed, so that a comparatively long period of time is required for latching operation. A large amount of current is not consumed for this operation.

Figure 12:
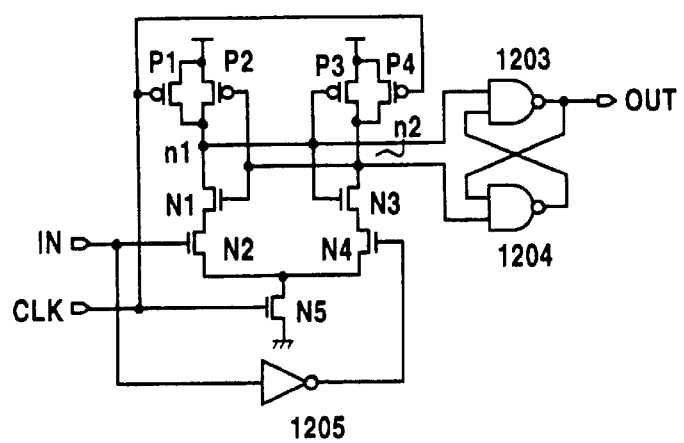
FIG. 12 is a circuit diagram illustrating a flip-flop for performing a comparatively fast latch operation.

FIG. 12 is a circuit diagram illustrating a flip-flop performing a comparatively fast latch operation. A transistor with a circular inversion symbol placed at its gate indicates a P type. In the flip-flop, a CMOS differential amplifier and a latch circuit are provided at the front stage, and the latch output is held by a latch circuit constituted by NAND gates 1203 and 1204 at the rear stage.

In the differential amplifier and the latch circuit at the front stage, an N type transistor N5 is rendered conductive by an H-level clock CLK, and the differential amplifier constituted by N type transistors N2 and N4 is activated to render conductive either transistor N2 or N4 in accordance with input IN. Then, a current according to the conductive transistor is supplied to transistors P2 and N1, or P3 and N3, of the latch circuit at the front stage. As a result, a node n1 or n2 goes to level L, and in response to this, the P type transistor P3 or P2 is rendered conductive to raise the opposite node n1 or n2 to level H. The latch output n1 and n2 are held by the latch circuit constituted by the NAND gates 1203 and 1204 at the rear stage. When the clock CLK goes to level L, the transistors P1 and P4 are rendered conductive and the nodes n1 and n2 are raised to level H and are reset. In this condition, there is no current consumed at the front stage. The latch circuit constituted by the NAND gates 1203 and 1204 holds the data.

In this circuit in FIG. 12, a comparatively large current can be supplied from the transistor N5 to the differential amplifier and the latch circuit at the front stage to perform a fast latch operation. Although the amount of current consumed is larger than that of the flip-flop in FIG. 11, a faster latch operation can be performed.

Figure 13:
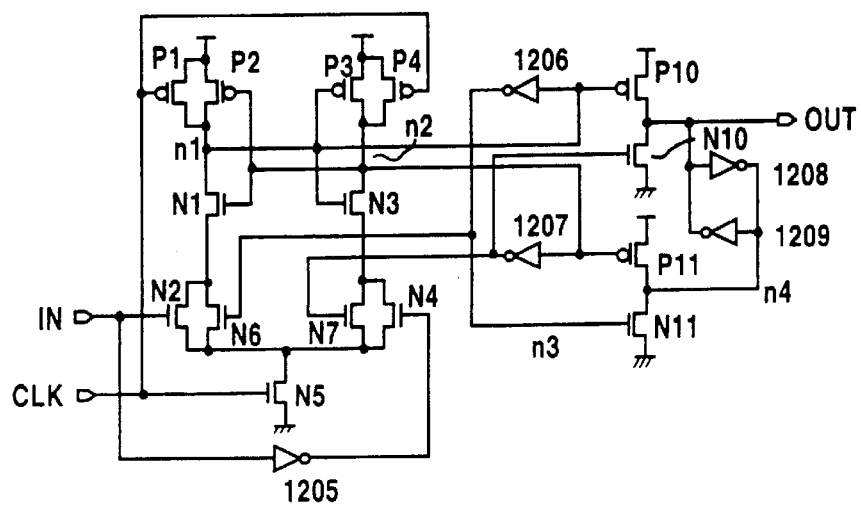
FIG. 13 is a circuit diagram illustrating a flip-flop for performing a faster latch operation.

FIG. 13 is a circuit diagram illustrating a flip-flop performing a faster latch operation. In this flip-flop, in addition to the differential amplifier and the latch circuit in the front stage in FIG. 12, the latch circuit at the rear stage includes CMOS inverters P10 and N10, and P11 and N11, which are set to a high impedance state at the reset when the clock CLK is at level L and both nodes n1 and n2 are at level H, and inverters 1208 and 1209, which are driven by the above inverters for the latch operation to hold data. The inverted signals of the nodes n1 and n2 are fed back via the inverters 1206 and 1207 to N transistors N6 and N7.

When the clock CLK goes to level H from the reset condition where the nodes n1 and n2 are at level H, the transistor N5 is rendered conductive, and in accordance with the data at input IN, either transistor N2 or N4 is rendered conductive to drop the node n1 or n2 to level L. If the input IN is at level H, the transistor N2 is rendered conducive and the node n1 is dropped. By dropping the node n1 to level L, the transistor P10 is rendered conductive and output OUTPUT goes to level H. The above feedback function includes a function for supporting the latch operation of the latch circuit in the front stage. When the output OUTPUT goes to level H, the inverters 1208 and 1209 constituting the latch circuit hold that condition. Since the latch circuit at the rear stage is not a cross-connection of two NAND gates, as shown in FIG. 12, its latch operation is performed at a higher speed.

Generally, in the latch circuit wherein the NAND gates 1203 and 1204 are crossed and connected together as shown in FIG. 12, when, for example, the condition where the nodes n1 and n2 are at level H is changed to the condition where node 1 is at level L, the output of its NAND gate 1203 j changed to level H. The inputs of the NAND gates 1204 are changed to level H, and the output is changed to level H. As a result, the level L of the output of the NAND gate 1203 is changed to the level H, regardless of the level L of the node n1. The latch operation is thereafter terminated. In other words, since the latch operation is completed after the period for the operations of two gate stages, the operation is performed comparatively slowly.

In the circuit constituted by the inverters 208 and 209 shown in FIG. 13, when the condition where the nodes n1 and n2 are at level H is changed to the condition where node n1 is at level L, the output OUT goes to level H by the transistor P10, and the output (node n4) of the inverter 1208 goes to level L. The latch operation is thereafter terminated. The change of the node n1 to level L alters the node n3 to level H via the inverter 1206, and the node n4 to level L via the transistor N11. Therefore, the operation is completed in two gate stages by the inverters, and can be performed at a higher speed than is the operation in FIG. 12.

The fast flip-flops in FIGS. 12 and 13 are employed for the input latch flip-flops For the serial/parallel converters in FIGS. 5 and 9, and the flip-flops in FIGS. 11 that require only a small amount of current, even though they perform the processing comparatively slowly, are employed for the other flip-flops.

As is described above, according to the present invention, a serial/parallel converter can be constituted by a small number of flip-flops, and accordingly, the amount of current consumption can be reduced.

In addition, according to the present invention, an input latch flip-flop is so designed that it consumes a large amount of current and that can perform a fast latch operation, while a flip-flop for latching previously latched data to enable parallel output is so designed that it performs comparatively slow processing and consumes only a small amount of current. As a result, the total amount of current consumption can be reduced, and data serially input at a high sped can likewise be latched at a high speed.

Figure 14:
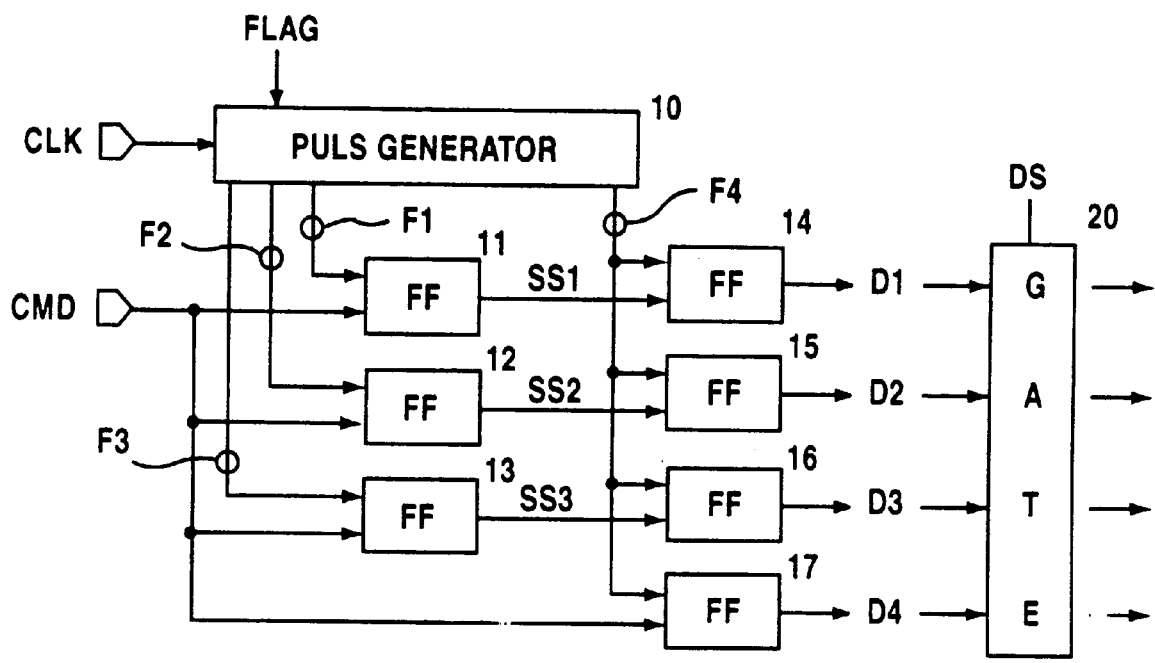
FIG. 14 is a diagram illustrating a serial/parallel converter proposed by the previously submitted patent application.

FIG. 14 is a diagram illustrating a serial/parallel converter similar to that shown in FIG. 1. The serial/parallel converter is an example one for four bits, as the length of the serial data. The supply of serial data is initiated at the leading edge of a clock, and the serial data are sequentially supplied both at the leading edge and at the trailing edge of the clock. A clock CLK, a command signal CMD and a flag signal FLAG, for example, are supplied externally.

The serial/parallel converter in FIG. 14 comprises: a pulse generator 10 for receiving a clock CLK and generating timing pulses F1 to F4; flip-flops 11 to 13 for fetching externally supplied serial command signals CMD in response to the timing pulses F1, F2 and F3; a flip-flop 17 for fetching a fourth command signal CMD in response to the timing pulse F4; and flip-flops 14 to 16 for also fetching the data latched by the flip-flops 11 to 13 in response to the timing pulse F4. With the double structure of the flip-flops 11 to 13 and 14 to 17, a small number of flip-flops can constitute a serial/parallel converter. In addition, since a fast-operating circuit is employed for the flip-flops 11 to 13, it can cope with serial data supplied in synchronization with the fast clock.

The serial data are fetched by the flip-flops 14 to 17 at the final timing pulse F4, and are supplied at an internal gate 20 to an internal circuit in response to a data strobe signal DS. The operational timing for the gate 20 is controlled by the data strobe signal DS generated at a predetermined timing from a flag signal FLAG designating the head of the serial data.

Figure 15:
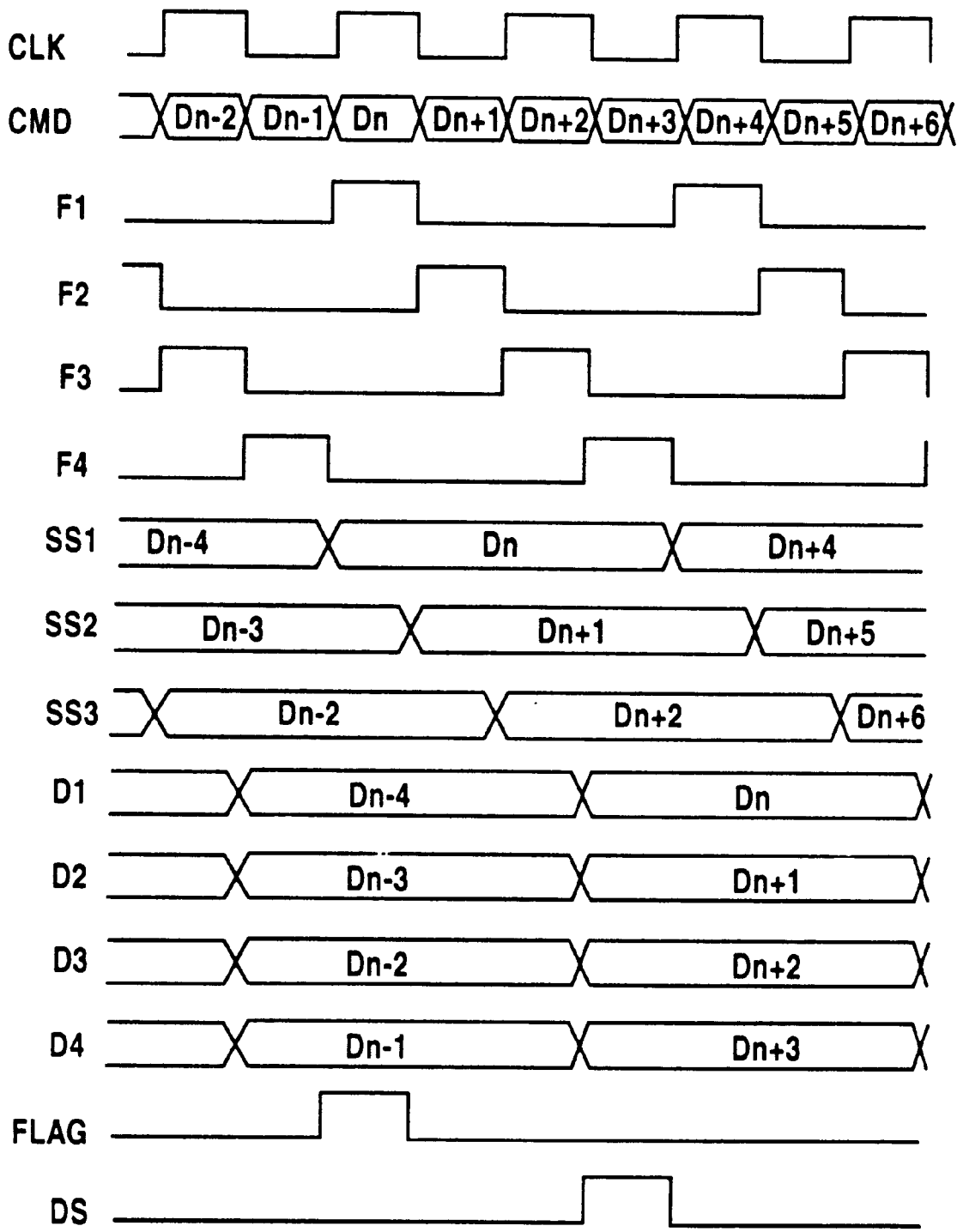
FIG. 15 is a timing chart showing an operation performed by the serial/parallel converter in FIG. 14.

FIG. 15 is a timing chart, which is similar to FIG. 4, showing the operation of the serial/parallel converter in FIG. 14. A command signal CMD is supplied in synchronization with the leading edge and trailing edge of the clock CLK. Of the 4 bits of serial data $D_n$ to $D_{n+3}$, the head data $D_n$ are supplied in synchronization with the flag signal FLAG, which designates the head of the command signal for the serial data. Then, the remaining serial data $D_{n+1}$, to $D_{n+3}$ are transmitted in synchronization with both edges of the clock CLK.

The first serial data $D_n$ are latched by the flip-flop 11 in response to a timing pulse F1, which is generated at the leading edge of the clock CLK when the flag signal FLAG is supplied. In response to the successively generated timing pulses F2 and F3, the serial data $D_{n+1}$ and $D_{n+2}$ are latched by the flip-flops 12 and 13, respectively. The last serial data $D_{n+3}$ are latched by the flip-flop 17 in response to the last timing pulse F4, and at the same time the data $D_n$, $D_{n+1}$ and $D_{n+2}$ are latched by the flip-flops 14, 15 and 16. As a result, outputs D1 to D4 of the flip-flops 14 to 17 are parallel data $D_n$ to $D_{n+3}$, as is shown in FIG. 15.

When the latched signals D1 to D4 are output in parallel by the gate circuit 20 at the timing of the strobe signal DS, which is generated from the flag signal FLAG at a predetermined timing.

As is described above, since the data strobe signal DS is generated independently of the serial/parallel converter, it is difficult to match the phase to the timing at which the serial data are latched by the second-stage flip-flops 14 to 17 of the serial/parallel converter. Therefore, the data strobe signal DS is generated at the time delayed with a specific margin, which becomes an obstacle for fast operation.

Fourth Embodiment

Figure 16:
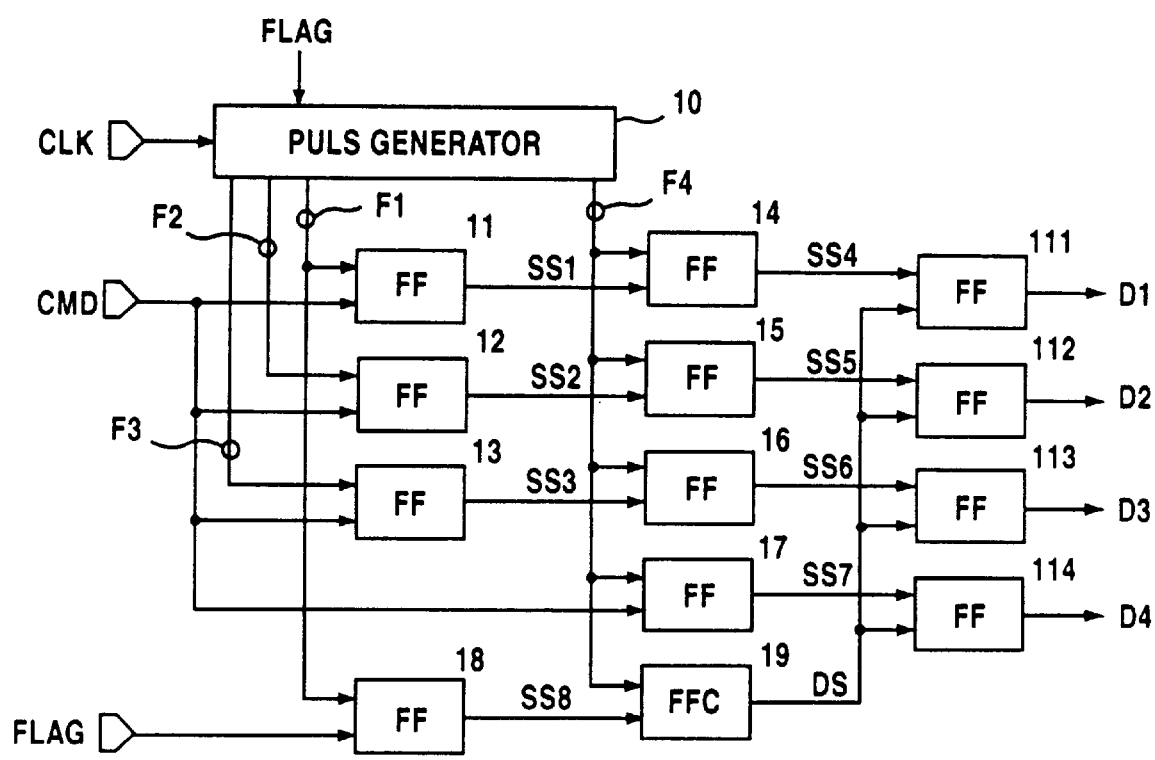
FIG. 16 is a diagram illustrating a serial/parallel converter according to a fourth embodiment.
Figure 17:
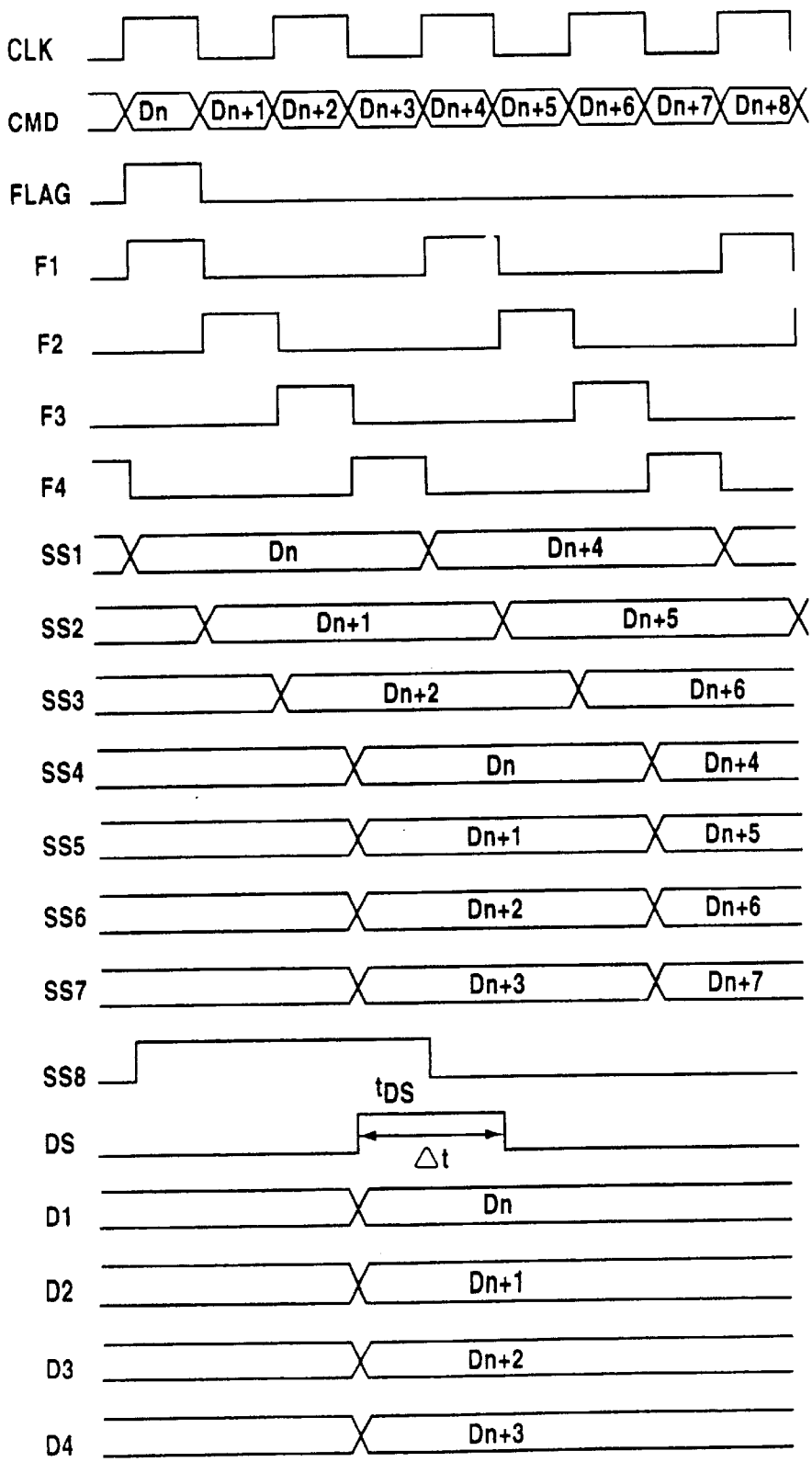
FIG. 17 is a timing chart for the serial/parallel converter in FIG. 16.

FIG. 16 is a diagram illustrating a serial/parallel converter according to a fourth embodiment of the present invention, and FIG. 17 is its timing chart. The same reference numerals are used as are used in FIG. 14 to denote corresponding components. Also, in the fourth embodiment, a command signal of four bits is supplied in synchronization with the leading edge and the trailing edge of a clock CLK. The first serial data are supplied in synchronization with the leading edge of a flag signal FLAG.

In the serial/parallel converter in FIG. 16 flip-flops 11 to 17 have the same structure as those in the circuit in FIG. 14, and their operations for latching signals in response to timing pulses F1 to F4 are also performed in the same manner. Initially, the first serial data $D_n$ is latched by the flip-flop 11 at the first stage in response to the timing pulse F1, which corresponds to the leading edge of the flag signal FLAG and is generated at the leading edge of the clock CLK. Then, an output signal SS1 is employed as the first serial data $D_n$, and in response to the timing pulse F1 the flag signal FLAG is latched by the flip-flop 18 at the first stage.

Similarly, the second serial data $D_{n+1}$ is latched by the flip-flop 12 at the first stage in response to the timing pulse F2, which is generated at the trailing edge of the clock CLK. The third serial data $D_{n+2}$ is latched by the flip-flop 13 at the first stage in response to the timing pulse F3, which is generated at the leading edge of the clock CLK. In response to the timing pulse F4, which is generated at the subsequent trailing edge of the clock CLK, the fourth serial data $D_{n+3}$ is latched by the flip-flop 17, and signals SS1 to SS3 outputs by the flip-flops 11 to 13 at the first stage and a signal SS8 output by the flip-flop 18 are latched by the flip-flops 14 to 16 and 19 at the second stage.

The serial data $D_n$ to $D_{n+3}$, which are latched in response to the timing pulse F4, are output as signals SS4 to SS7 and latched in parallel by flip-flops 111 to 114 of gate means at the final stage, in response to the leading edge of a data strobe signal DS (timing tDS in FIG. 17), which is output by the flip-flop 19 at the second stage. The data $D_n$ to $D_{n+3}$, generated at the parallel output terminals D1 to D4, are employed by an internal circuit provided at the following stage.

As is described above, since a circuit for latching the flag signal FLAG in response to a timing pulse used for the serial/parallel conversion is additionally provided for the serial/parallel converter, the data strobe signal DS can be output at the timing $t_{DS}$ whereat the flip-flops 14 to 17 have latched all the serial data at the second stage. Since the delay time required for the latching of the flip-flop 19 matches the delay time required for the latching of the flip-flops 14 to 17, the data strobe signal Ds carries the shortest timing $t_{DS}$, and as a result, appropriate serial data $D_n$ to $D_{n+3}$ can be output in parallel at an appropriate timing.

The flip-flop at the second stage 19 is a self-clear flip-flop which can clear its output following the elapse of a predetermined delay time Δt. This circuit will be explained in detail later.

Figure 18:
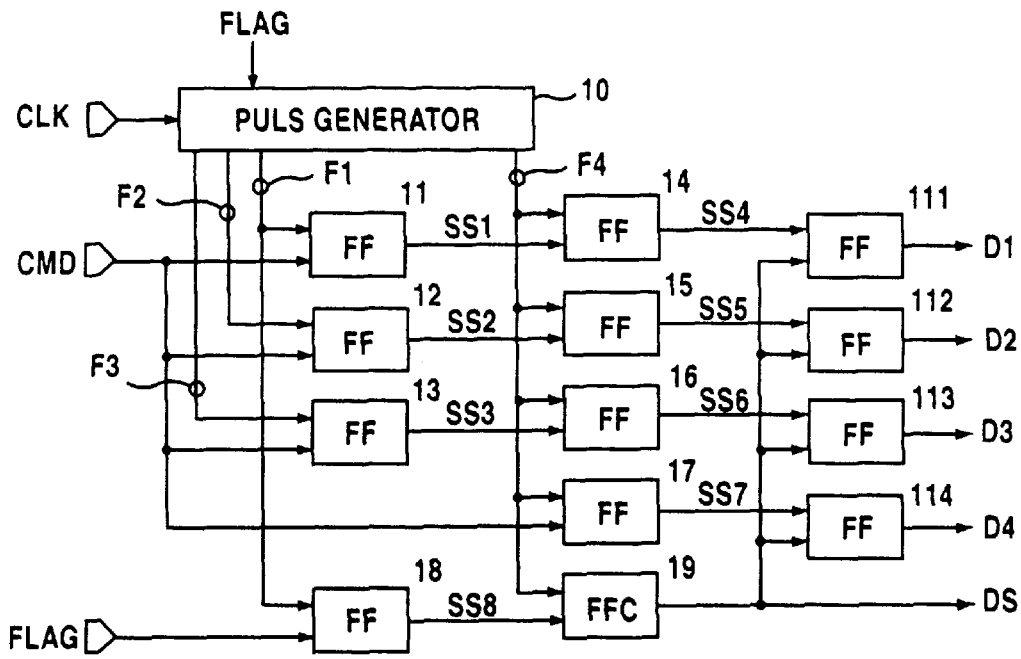
FIG. 18 is a diagram illustrating a modification of the fourth embodiment.

FIG. 18 is a diagram illustrating a modification of the fourth embodiment. The same reference numerals are used as are used in FIG. 16 to denote corresponding components. In this modification, a data strobe signal DS latched by a flip-flop 19 is output at a timing whereat flip-flops 111 to 114 latch data, so that the data strobe signal DS can be employed by an internal circuit (not shown). The other sections in this circuit are the same as those shown in FIG. 16.

Figure 19:
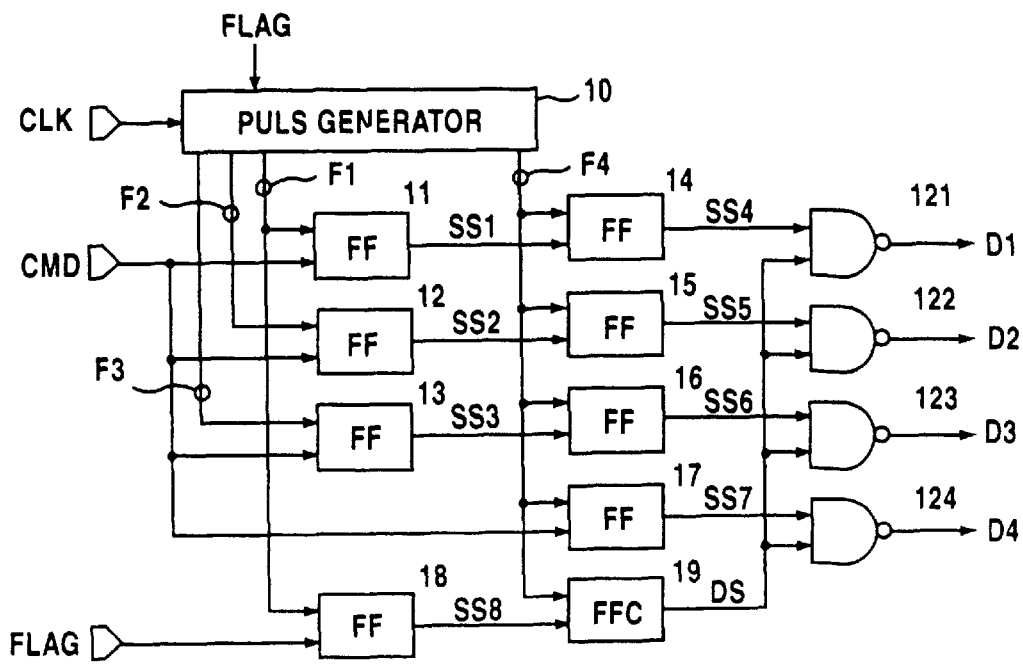
FIG. 19 is a diagram illustrating another modification of the fourth embodiment.

FIG. 19 is a diagram illustrating another modification of the fourth embodiment, and the same reference numerals are used as are used in FIG. 16 to denote corresponding components. In this modification, the flip-flops 111 to 114 at the final stage are replaced by NAND gates 121 to 124. Signals SS4 to SS7, output by flip-flops 14 to 17, are transmitted to input terminals of the NAND gates 121 to 124, and a data strobe signal DS is supplied to their other input terminals.

Figure 20:
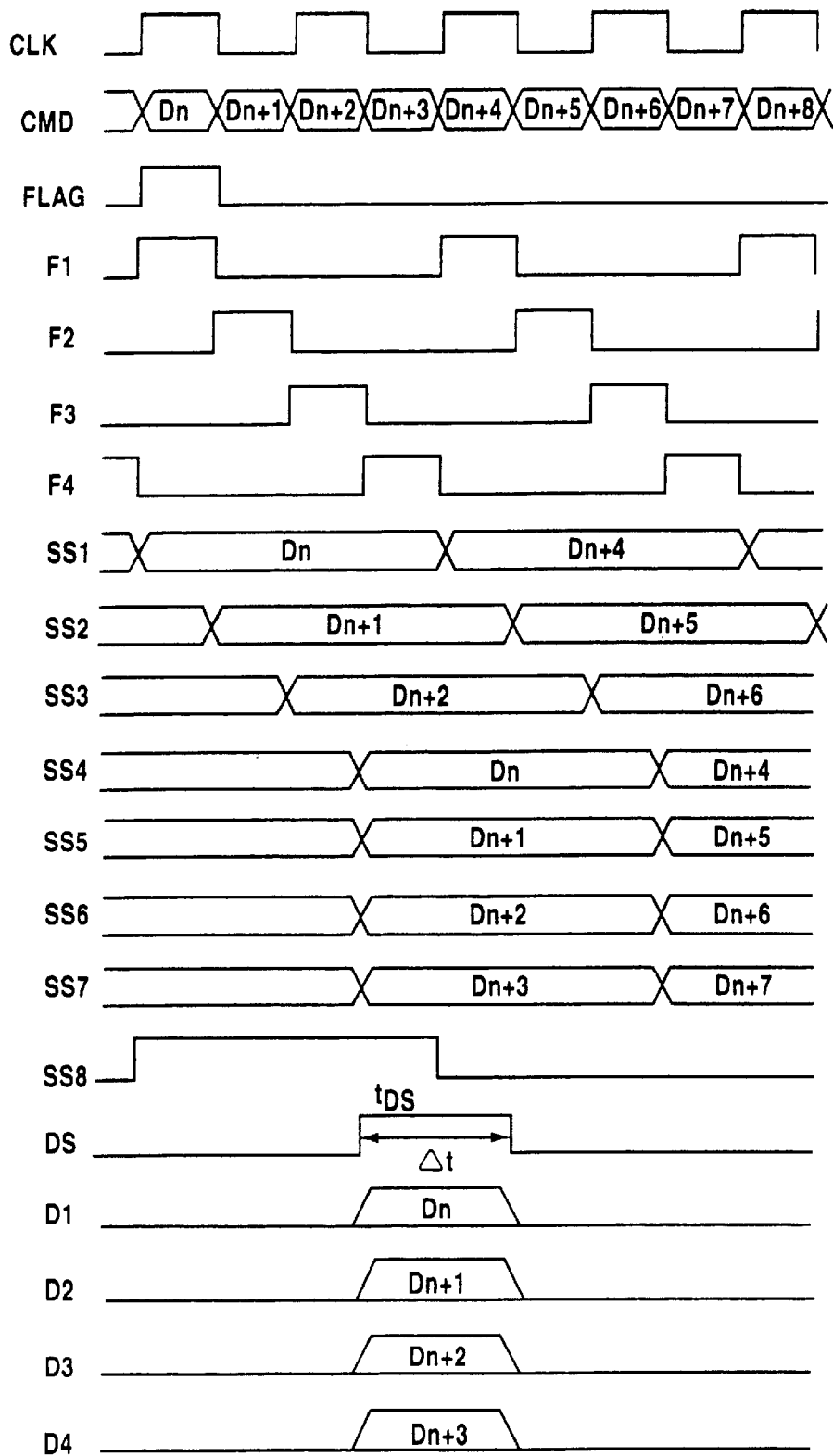
FIG. 20 is a timing chart for the modification in FIG. 19.

FIG. 20 is a timing chart for the circuit in FIG. 19. A difference from the timing chart in FIG. 17 is that data $D_n$ to $D_{n+3}$ are output at terminals D1 to D4 of the NAND gates 121 to 124 in synchronization with the leading edge of the data strobe signal DS, and that the output of the data $D_n$ to $D_{n+3}$ is continued only while the data strobe signal DS is at level H. The other operation is performed in the same manner as the like operation in FIG. 16.

As is described above, in the fourth embodiment, a flag signal FLAG is fetched in response to a timing pulse F1, and further is latched in response to a timing pulse F4 in the same manner as in the serial/parallel operation. The latch output is then employed as a data strobe signal DS, so that it is possible to generate a data strobe signal DS, the output timing of which matches the operation timing of the serial/parallel converter. Therefore, the parallel output of data can be performed by using the data strobe signal DS having the matching timing necessarily. As a result, after the generation of the flag signal FLAG 4-bit serial data can be output in parallel as appropriate data at the optimal timing.

The fourth embodiment can be applied for 8-bit serial data. In this case, seven bits are latched by the flip-flops at the first stage, while the eighth bit is latched by a flip-flop at the second stage; and in response to the data strobe signal, the serial data are latched by the flip-flops at the final stage. Or, else first three bits of the serial data are latched by the flip-flops at the first stage, while a fourth bit is latched by a flip-flop at the second stage, and after this latching process has been repeated, all the serial data are latched by the flip-flops at the final stage.

Fifth Embodiment

Figure 21:
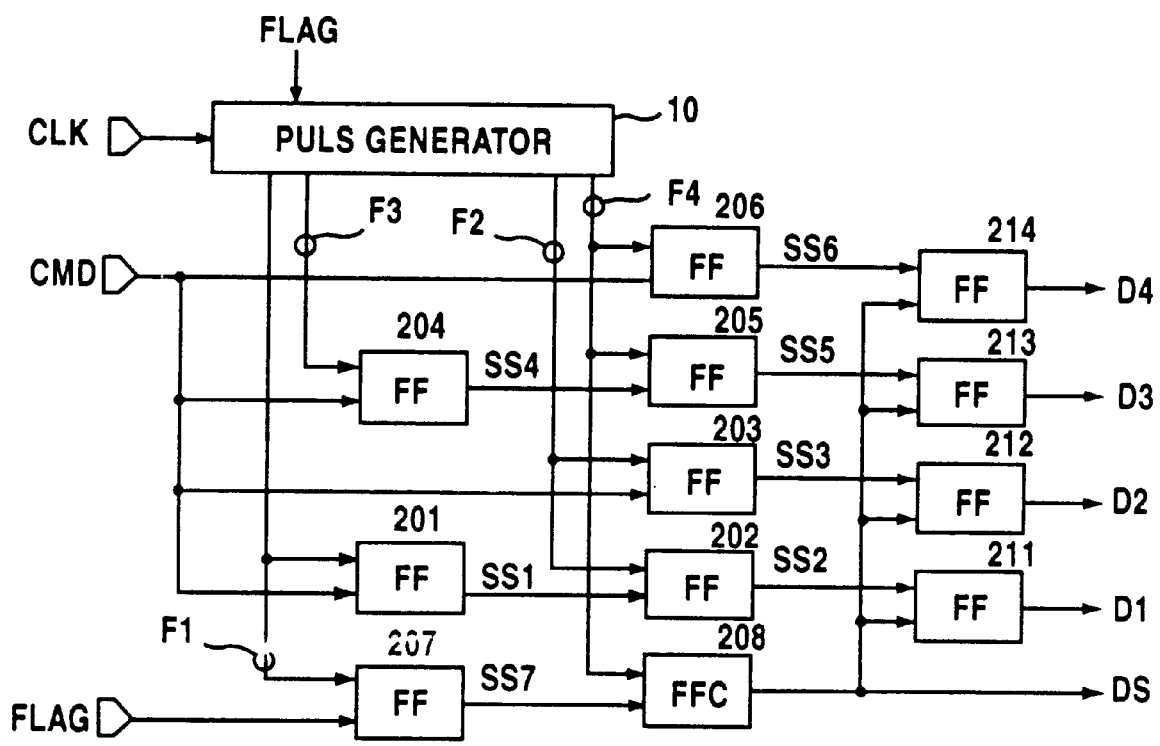
FIG. 21 is a diagram illustrating a serial/parallel converter according to a fifth embodiment.

FIG. 21 is a diagram illustrating a serial/parallel converter according to a fifth embodiment of the present invention. In this embodiment, as well as in the fourth embodiment, a circuit for latching a flag signal FLAG is provided for the serial/parallel converter, and the timing for the generation of a data strobe signal DS, which is a timing signal for parallel output at the final stage, matches the serial/parallel conversion. In the fourth embodiment, of 4 bits of serial data, the first three bits are fetched by three flip-flops, and the fourth bit and three bits that were latched previously are fetched at the same time by four flip-flops. In the fifth embodiment, however, serial data are fetched two bits at a time.

Specifically, as is shown in FIG. 21, the first serial data Dn is latched by a flip-flop 201 at the first stage in response to a timing pulse F1, which is the edge of a flag signal FLAG and is generated at the leading edge of a clock CLK. In response to the following timing pulse F2, the second serial data Dn, and the data Dn latched by the flip-flop 201 are respectively latched by flip-flops 203 and 202 at the second stage. Similarly, in response to a timing pulse F3, the third serial data $D_{n+2}$ is latched by a flip-flop 204 at the first stage. Then, in response to the following timing pulse F4, the fourth serial data $D_{n+3}$ and the data $D_{n+2}$ latched by the flip-flop 204 are latched respectively by flip-flops 206 and 205 at the second stage. The latch operation for the flag signal FLAG is the same as in the fourth embodiment.

Therefore, at the first stage there are only two flip-flops, which is fewer than the three employed in the fourth embodiment.

Figure 22:
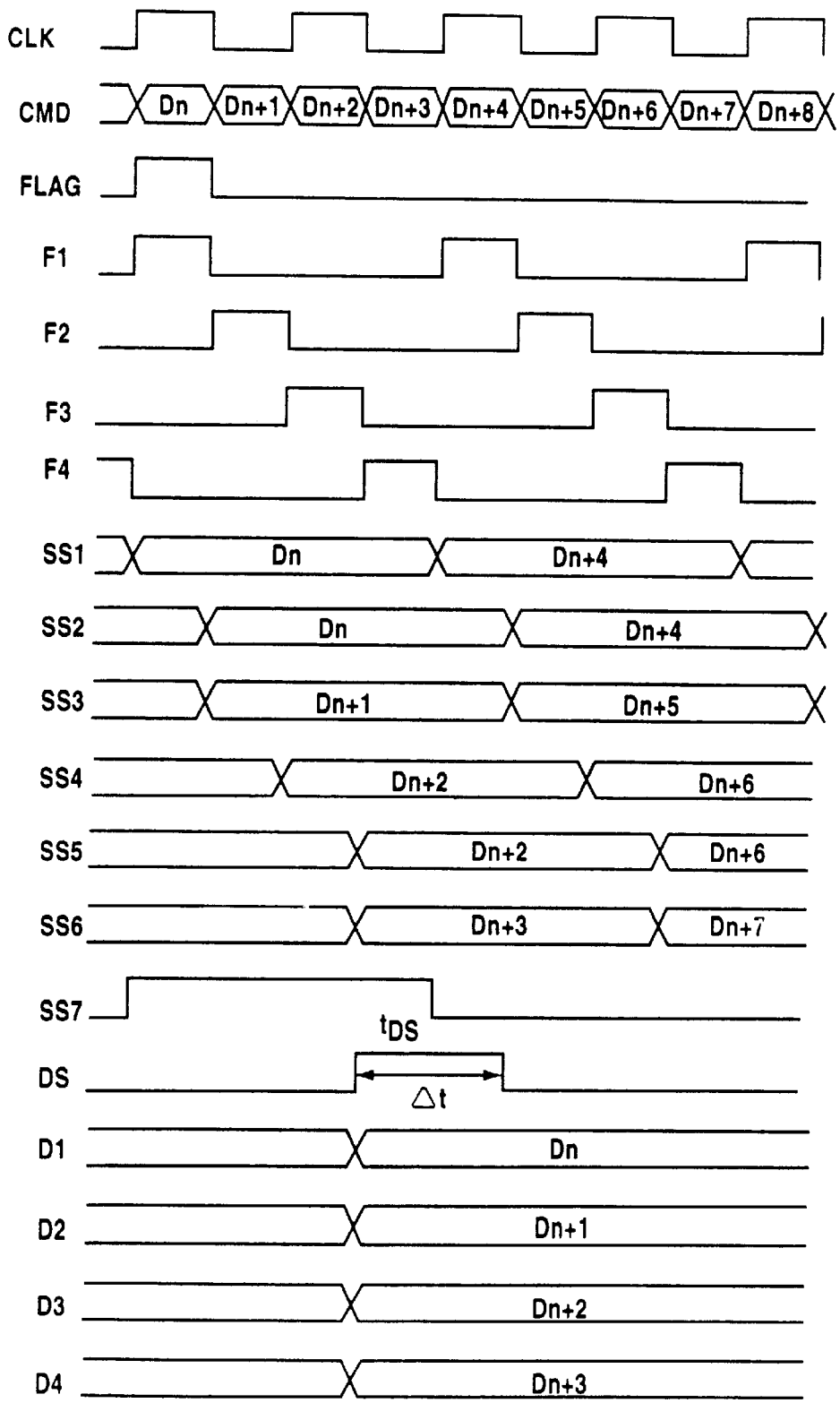
FIG. 22 is a timing chart for the serial/parallel converter in FIG. 21.

FIG. 22 is a timing chart for FIG. 21. As is shown in FIG. 22, in response to the timing pulse F1, which is the leading edge of the flag signal FLAG and is generated at the leading edge of the clock CLK, the first serial data $D_n$ of a command signal CMD is latched by the flip-flop 201 at the first stage, and at the same time the flag signal FLAG is latched by a flip-flop 207 at the first stage. Then, in response to a timing pulse F2 generated at the trailing edge of the clock CLK, the second serial data $D_{n+1}$ is latched by a flip-flop 203 at the second stage, and the first data $D_n$, latched by the flip-flop 201, is also-latched by a flip-flop 202.

In response to a timing pulse F3 generated at the following leading edge of the clock CLK, the third serial data $D_{n+3}$, of the command signal CMD is latched by a flip-flop 204 at the first stage. Then, in response to a timing pulse F4 generated at the trailing edge of the clock CLK, the fourth serial data $D_{n+3}$ is latched by a flip-flop 206 at the second stage, and the third data $D_{n+2}$, latched by the flip-flop 204, is also latched by a flip-flop 205. Also, in response to the timing pulse F4, the flag signal FLAG, latched by the flip-flop 207, is latched by a flip-flop 208 at the second stage.

A data strobe signal DS is generated at the timing $t_{DS}$ by the flip-flop 208 at the second stage, whereat the third and the fourth serial data, $D_{n+2}$ and $D_{n+3}$, are latched by the flip-flops 205 and 206 and are output at the output terminals SS5 and SS6. Therefore, at an optimal timing, the data $D_n$ to $D_{n+3}$ at the output terminals SS2, SS3, SS5 and SS6 are latched in parallel by flip-flops 211 to 214 at the final stage.

Since in the fifth embodiment serial data are latched in sets of two bits by the flip-flops at the first stage-and the flip-flops at the second stage, fewer flip-flops are required at the first stage than are required for the fourth embodiment. The fifth embodiment can be applied in the same manner for 8-bit serial data and for 16-bit serial data. In these cases, the output of the flip-flop 207 at the first stage need only be latched by the flip-flop 208 at the second stage in response to the final timing pulse.

Sixth Embodiment

Figure 23:
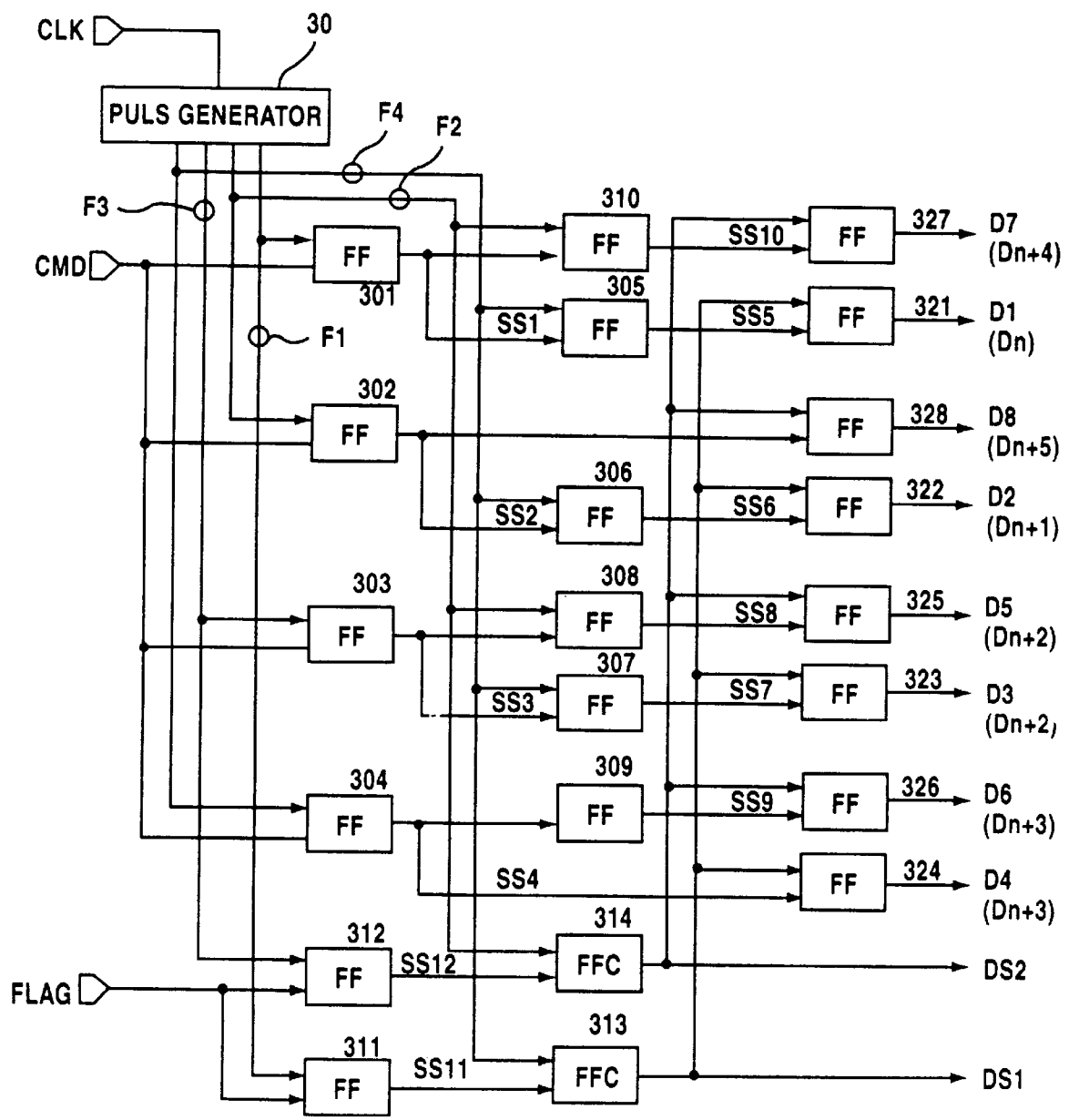
FIG. 23 is a diagram illustrating a serial/parallel converter according to a sixth embodiment.
Figure 24:
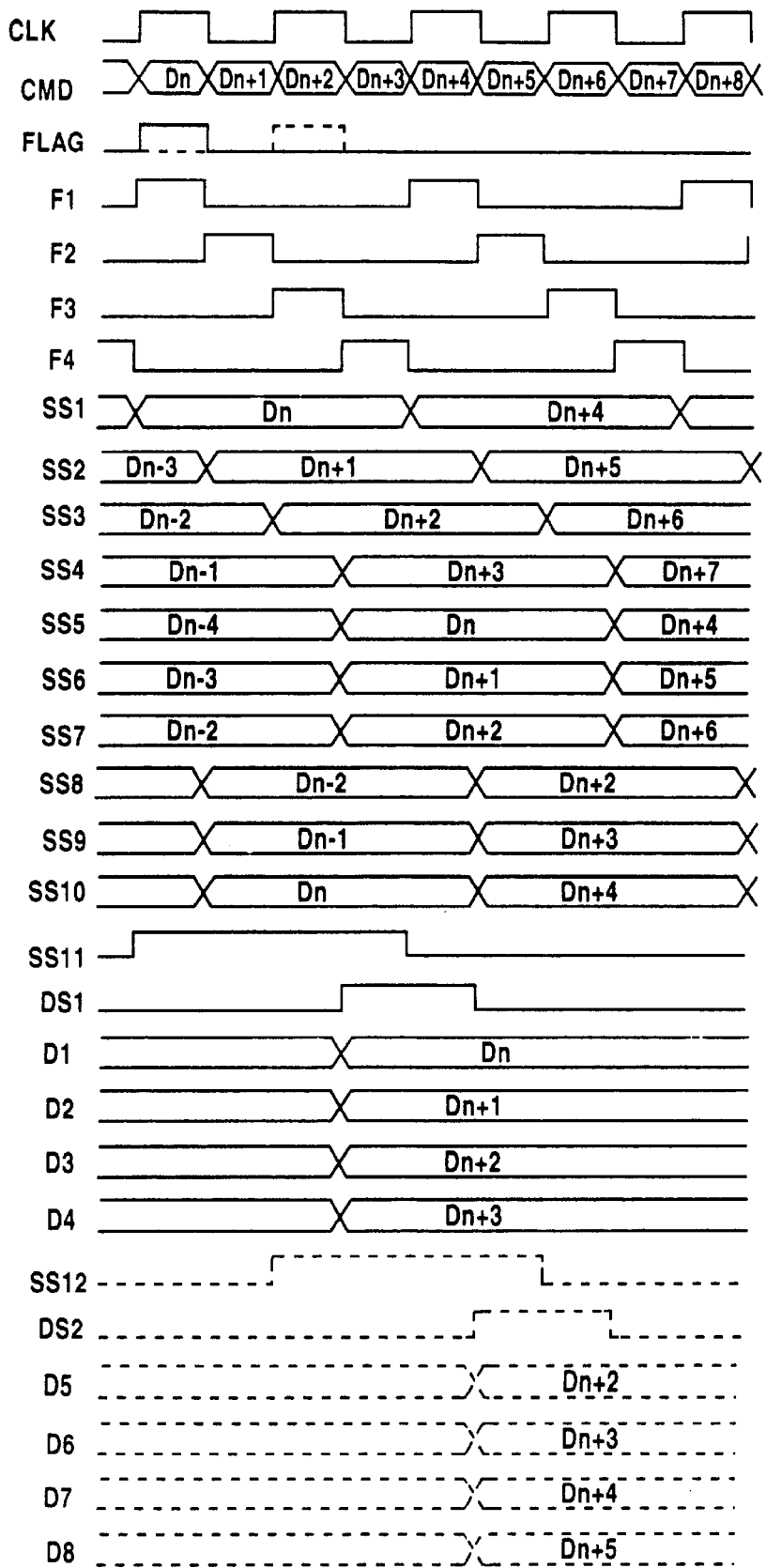
FIG. 24 is a timing chart for the serial/parallel converter in FIG. 23.

FIG. 23 is a diagram illustrating a serial/parallel converter according to a sixth embodiment of the present invention, and FIG. 24 is its timing chart; In the sixth embodiment also, serial data are supplied in synchronization with the leading edge and the trailing edge of a clock CLK. In the fourth and the fifth embodiments, in response to the leading edge of the flag FLAG, a pulse generator 10 generates timing pulses F1 to F4 in order, beginning at the leading edge of the clock CLK, which corresponds to the supply of the command signal. However, when there is a premise that the first data of the 4 bits of serial data is to be supplied in response to the leading edge of the clock CLK, the condition limiting the generation of the timing pulses F1 to F4 of the pulse generator 10 can be eliminated.

Specifically, on the premise that the leading edge of a flag signal FLAG, which represents the first serial data, is synchronized with the leading edge of the clock CLK, which indicates the start of the supply of data, the pulse generator 10 need only generate the timing pulses F1 and F3 in response to the leading edge of the clock CLK, and the timing pulses F2 and F4 in response to the trailing edge of the clock CLK. In the sixth embodiment, a circuit is provided which latches 4 bits of serial data from the timing pulse F1 and 4 bits of serial data from the timing pulse F3, and either 4 bits of serial data are output in parallel in response to the leading edge of the flag signal FLAG.

As is shown in FIG. 23, in the sixth embodiment, a pulse generator 30 is provided which generates the timing pulses F1 and F3 at the leading edge of the clock CLK, and the timing pulses F2 and F4 at the trailing edge of the clock CLK. Provided at the first stage are flip-flops 301 to 304, which latch a command signal, which is serial data, in response to the timing pulses F1 to F4; and provided at the second stage are flip-flops 305 to 310, which latch the first 3 bits of data in response to the timing pulse F4 or F2 for the final bit of the 4 bits of serial data. In addition, provided at the final stage are a first group of flip-flops 321 to 324, which latch-in parallel 4 bits of data from the flip-flops 305, 306, 307 and 304 in response to a data strobe signal DS1; and a second group of flip-flops 325 to 328, which latch in parallel 4 bits of data from the flip-flops 308, 309, 310 and 302 in response to the data strobe signal DS2. The flip-flops at the second stage are sorted into two groups: a first group of flip-flops 305, 306 and 307 for latching the 3 bits of data from the timing pulse F1, and a second group of flip-flops 308, 309 and 310 for latching the 3 bits of data from the timing pulse F3.

The flag signal FLAG is supplied to a first data strobe signal generator, which includes at the first stage a flip-flop 311 for latching the signal FLAG at the timing pulse F1 and at the second stage a flip-flop 313 for latching a signal SS11 output by the flip-flop 311 in response to the timing pulse F4; and to a second data strobe signal generator, which includes a flip-flop 312 at the first stage for latching the flag signal FLAG in response to the timing pulse F3 and a flip-flop 314 at the second stage for latching a signal SS12 output by the flip-flop 312 in response to the timing pulse F2. Then, in response to first and second data strobe signals DS1 and DS2, generated by the first and the second data strobe signal generators, 4 bits of data are output in parallel to the first and the second flip-flop groups 321–324, 325–328 at the final stage.

As is described above, in the sixth embodiment, since the first serial data is made available in accordance with the timing pulse F1 or F3 on the premise that the leading edge of the flag signal FLAG representing the first serial data is synchronized with the leading edge of the clock CLK, provided are two groups for the flip-flops at the second stage and for the flip-flops at the final stages in the fourth embodiment in FIG. 16. The individual flip-flop groups at the second stage latch 4 bits of serial data which were latched from the timing pulse F1 and the 4 bits of serial data which were latched from the timing pulse F3, and the flip-flop groups at the final stage latch these data in parallel in response to the data strobe signals DS1 and DS2, which are generated in response to the flag signal FLAG. Therefore, the pulse generator 30 cyclically generates the timing pulses F1 to F4 simply in response to the clock CLK regardless of the flag signal FLAG.

The processing performed by the circuit shown in FIG. 23 will now be described while referring to FIG. 24. In FIG. 24, at a portion for a flag signal FLAG indicated by the solid line, 4 bits of serial data, D, to $D_{n+3}$, are supplied from the timing pulse F1, and at the portion of the flag signal FLAG indicated by the broken line, 4 bits of serial data, $D_{n+2}$ to $D_{n+5}$, are supplied from the timing pulse F3. Therefore, in FIG. 24 the data $D_n$ to $D_{n+3}$ are output at the output terminals DI to D4 of the first group flip-flops 321 to 324 at the final stage in response to the data strobe signal DS1, which is generated upon receipt of the flag signal FLAG indicated by the solid line. The data $D_{n+2}$ to $D_{n+5}$ are output at the output terminals D5 to D8 of the second group flip-flops 325 to 328 at the final stage in response to the data strobe signal DS2, which is generated upon receipt of the flag signal FLAG indicated by the broken line.

First, an explanation will be given for the processing performed upon the receipt of the flag signal FLAG indicated by the solid line. In response to the timing pulse F1 generated at the leading edge of the clock CLK, the first data $D_n$ is latched by the flip-flop 301 at the first stage, and at the same time, the flag signal FLAG is latched by the flip-flop 311 at the first stage. Since the flag signal FLAG indicated by the solid line is at level H, accordingly, the output SS11 of the flip-flop 311 goes to level H. Following this, the second data $D_{n+1}$ is latched by the flip-flop 302 at the first stage in response to the timing pulse F2 generated at the trailing edge of the clock CLK. Similarly, the third data $D_{n+2}$ is latched by the flip-flop 303 at the first stage in response to the timing pulse F3. Although the flag signal FLAG is also latched by the flip-flop at the first stage in response to the timing pulse F3, in this example it has already been driven to level L, and the output SS12 of the flip-flop 312 is maintained at level L.

In response to the timing pulse F4, the final data $D_{n+3}$ is latched by the flip-flop 304 at the first stage, and at the same time, the data $D_n$ to $D_{n+3}$, latched by the flip-flops 301, 302 and 303, are respectively latched by the first flip-flops 305, 306 and 307 at the second stage. In addition, the flag signal FLAG which was latched by the flip-flop 311 is latched at the second stage by the flip-flop 313 at the second stage in response to the timing pulse F4. The signal output by the flip-flop 313 is the first data strobe signal DS1.

The first data strobe signal DS1 output by the flip-flop 313 rises in response to the timing pulse F4, and in synchronization with the timing when the first flip-flops 305 to 307 at the second stage have latched the data. In response to the leading edge of the first data strobe signal DS1, the first group flip-flops 321 to 324 at the final stage latch the data $D_n$ to $D_{n+3}$ which are respectively output at the terminals SS5, SS6 and SS7 of the first group flip-flops 305 to 307 at the second stage and at the terminal SS4 of the flip-flop 304 at the first stage. As a result, the 4 bits of parallel data $D_n$ to $D_{n+3}$ are output at the output terminals D1 to D4.

Since the second data strobe signal DS2 does not rise in response to the timing pulse F4, at the final stage the second flip-flops 325 to 328 do not latch data.

Next, an explanation will be given for the processing performed upon the receipt of a flag signal FLAG indicated by the broken line. In this case, serial data $D_{n+2}$ to $D_{+5}$ are converted into parallel data. First, in response to the timing pulse F3 generated at the leading edge of the clock CLK, the first data Dn+2 is latched by the flip-flop 303 at the first stage, and at the same time the flag signal FLAG is latched by the flip-flop 312 at the first stage. Then, in response to the timing pulses F4, F1 and F2, data $D_{n+3}$, $D_{n+4}$ and $D_{n+5}$ are latched by the flip-flops 304, 301 and 302 at the first stage. Further, in response to the timing pulse F2, the three data sets $D_{n+2}$, $D_{n+3}$ and $D_{n+4}$ latched by the flip-flops 303, 304 and 301 at the first stage, are latched by the second flip-flops 308, 309 and 310 at the second stage. Also in response to the timing pulse F2, the flag signal FLAG latched by the flip-flip 312 is latched by the flip-flop 314 at the second stage.

The data strobe signal DS2 output by the flip-flop 314 rises in response to the timing pulse F2 after the latching operation has been completed. In response to the leading edge of the data strobe signal DS2, the data $D_{n+2}$ to $D_{n+5}$ are latched in parallel by the second group flip-flops 325 to 328 at the final stage.

The flip-flops at the final stage of the serial/parallel converter shown in FIG. 23 may be the NAND gates, as shown in FIG. 19.

Seventh Embodiment

Figure 25:
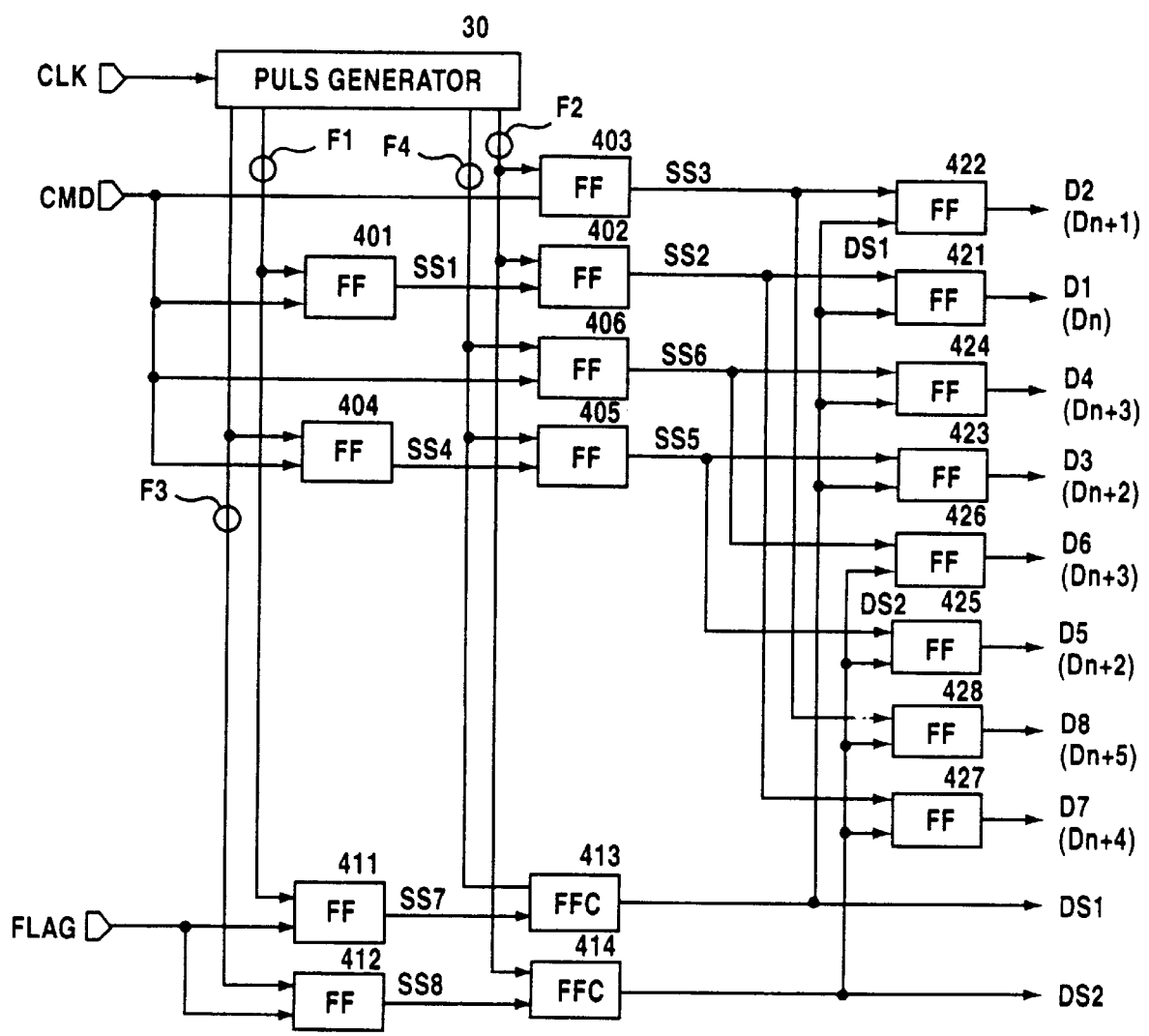
FIG. 25 is a diagram illustrating a serial/parallel converter according to a seventh embodiment.
Figure 26:
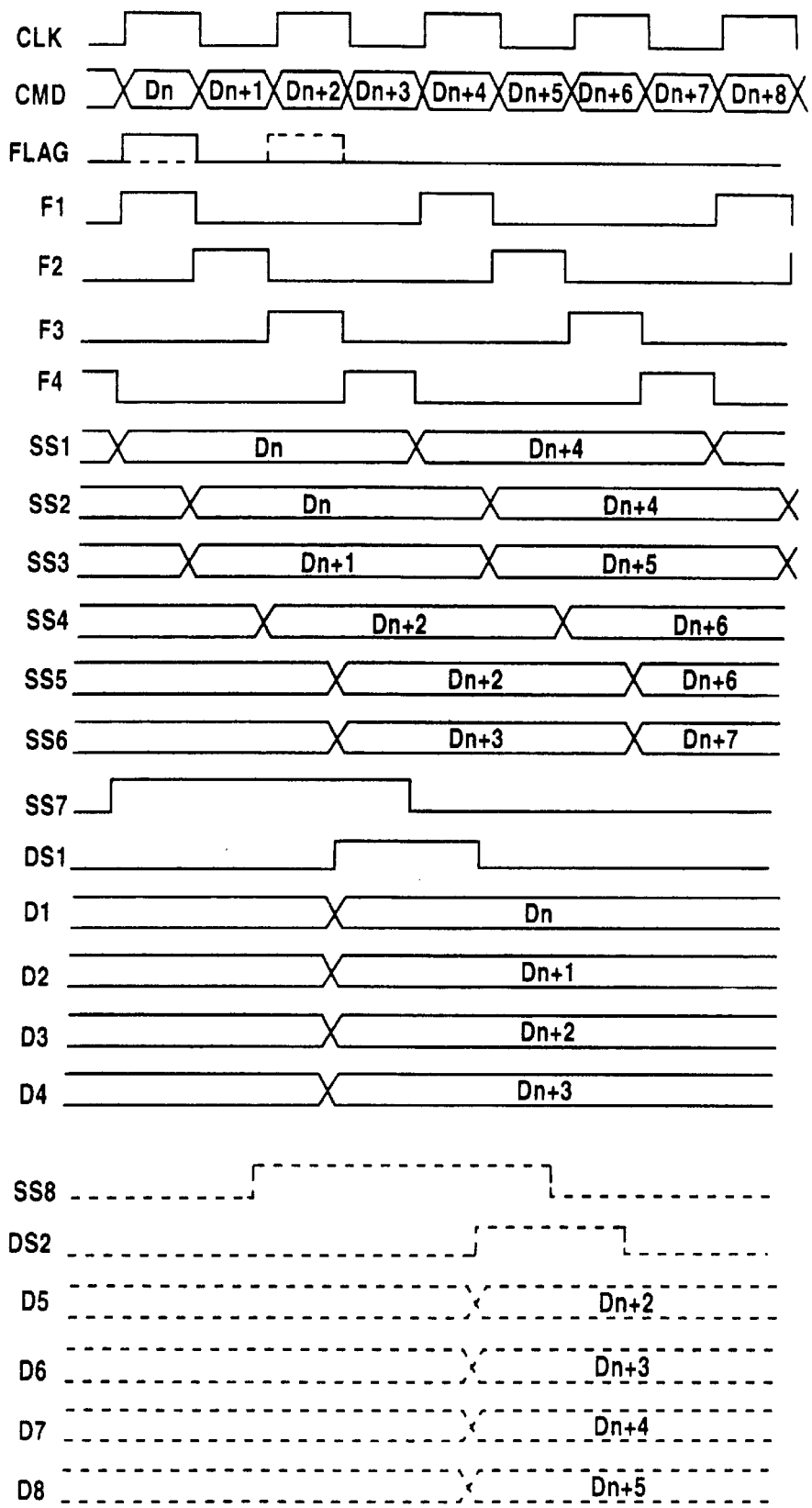
FIG. 26 is a timing chart for the serial/parallel converter in FIG. 25.

FIG. 25 is a diagram illustrating a serial/parallel converter according to a seventh embodiment of the present invention, and FIG. 26 is its timing chart. As well as in the sixth embodiment, the serial/parallel converter in the seventh embodiment is constituted on the premise that the leading edge of a flag signal FLAG is synchronized with the leading edge of a clock CLK. In this embodiment, the serial/parallel converter shown in the fifth embodiment in FIG. 21 is employed and has two groups of flip-flops at the final stage, as in the sixth embodiment.

That is, in FIG. 25, flip-flops 401 to 406 have the same structure as do the flip-flops 201 to 206 in FIG. 21. More specifically, data sets of two bits each are latched by the flip-flop 401 at a first stage and by the flip-flops 402 and 403 at a second stage, also latched by the flip-flop 404 at a first stage and by the flip-flops 405 and 406 at the second stage. In response to the first data strobe signal DS1, the data latched by the flip-flops 402, 403, 405 and 406 at the second stage are latched by first group flip-flops 421 to 424 at the final stage, and in response to the second data strobe signal DS2, are latched by second group flip-flops 425 to 428 at the final stage.

In response to the timing pulse F1, the flag signal FLAG is latched by a flip-flop 411. The latched signal is then latched by a flip-flop 413 in response to the timing pulse F4, and the first data strobe signal DS1 is generated. In response to the timing pulse F3, the flag signal FLAG is latched by a flip-flop 412. The latched flag signal is then latched by a flip-flop 414 in response to the timing pulse F2, and the second data strobe signal DS2 is generated. This arrangement is the same as that in the sixth embodiment.

The processing performed by the serial/parallel converter in FIG. 25 will now be explained while referring to FIG. 26. First, an explanation will be given for the processing performed upon the receipt of a flag signal FLAG indicated by a solid line. In this case, serial data are supplied from the timing pulse F1. In response to the timing pulse F1, the first data Dn of a command signal CMD is latched by the flip-flop 401, and at the same time the flag signal FLAG is latched by the flip-flop 411. As a result, the output SS7 of the flip-flop 411 goes to level H. Following this, in response to the timing pulse F2 the second data $D_{n+1}$ is latched by the flip-flop 403 at the second stage, and the data $D_n$ latched by the flip-flop 401 is latched by the flip-flop 402 at the second stage.

In response to the timing pulse F3 the third data $D_{n+2}$ is latched by the flip-flop 404. Although the flag signal FLAG is also latched by the flip-flop 412 in response to the timing pulse F3, the flag signal FLAG at this time is at level L, and accordingly the output SS8 is maintained at level L. In response to the timing pulse F4, the fourth data $D_{n+3}$ is latched by the flip-flop 406 at the second stage, and the third data $D_{n+2}$ latched by the flip-flop 404 is also latched by the flip-flop 405 at the second stage. Also the flag signal FLAG latched by the flip-flop 411 is latched by the flip-flop 413. As a result, the data strobe signal DS1 output by the flip-fop 413 rises in synchronization with the timing when the flip-flops at the second stages have completed their latch operations. In response to the leading edge of the data strobe signal DS1, the first group flip-flops 421 to 424 at the final stage latch in parallel the data $D_n$ to $D_{n+3}$ output at the output terminals SS2, SS4, SS5 and SS6 of the flip-flops at the second stage. Therefore, the parallel data $D_n$ to $D_{n+3}$ are output at the output terminals D1 to D4.

Next, an explanation will be given for the processing performed upon the receipt of a flag signal FLAG indicated by the broken line. The serial data $D_{n+2}$ to $D_{n+5}$ are latched in order by the flip-flops at the first and the second stages in response to the timing pulses F3, F4, F1 and F2. The flag signal FLAG is latched by the flip-flop 412 in response to the timing pulse F3, and is further latched by the flip-flop 414 in response to the timing pulse F2. The data $D_{n+2}$ to $D_{n+5}$ are simultaneously latched by the second group flip-flops 425 to 428 at the final stage in response to the leading edge of the data strobe signal DS2 output by the flip-flop 414. As a result, parallel data $D_{n+2}$ to $DD_{n+5}$ are output at the output terminals D5 to D8.

As is described above, since in the seventh embodiment sets of two bits of serial data are latched by the flip-flops at the first and the second stages, the number of flip-flops required at the first and the second stages is fewer than is required for the sixth embodiment. In other words, the flip-flops at the second stage do not constitute double structures, as in the sixth embodiment, and only the flip-flops at the final stage are sorted into a first and a second group. Also in the seventh embodiment, the flip-flops at the final stage may be replaced by NAND gates. The seventh embodiment can be applied for serial data sets of 8 bits, or 16 or more bits.

Eighth Embodiment

Figure 27:
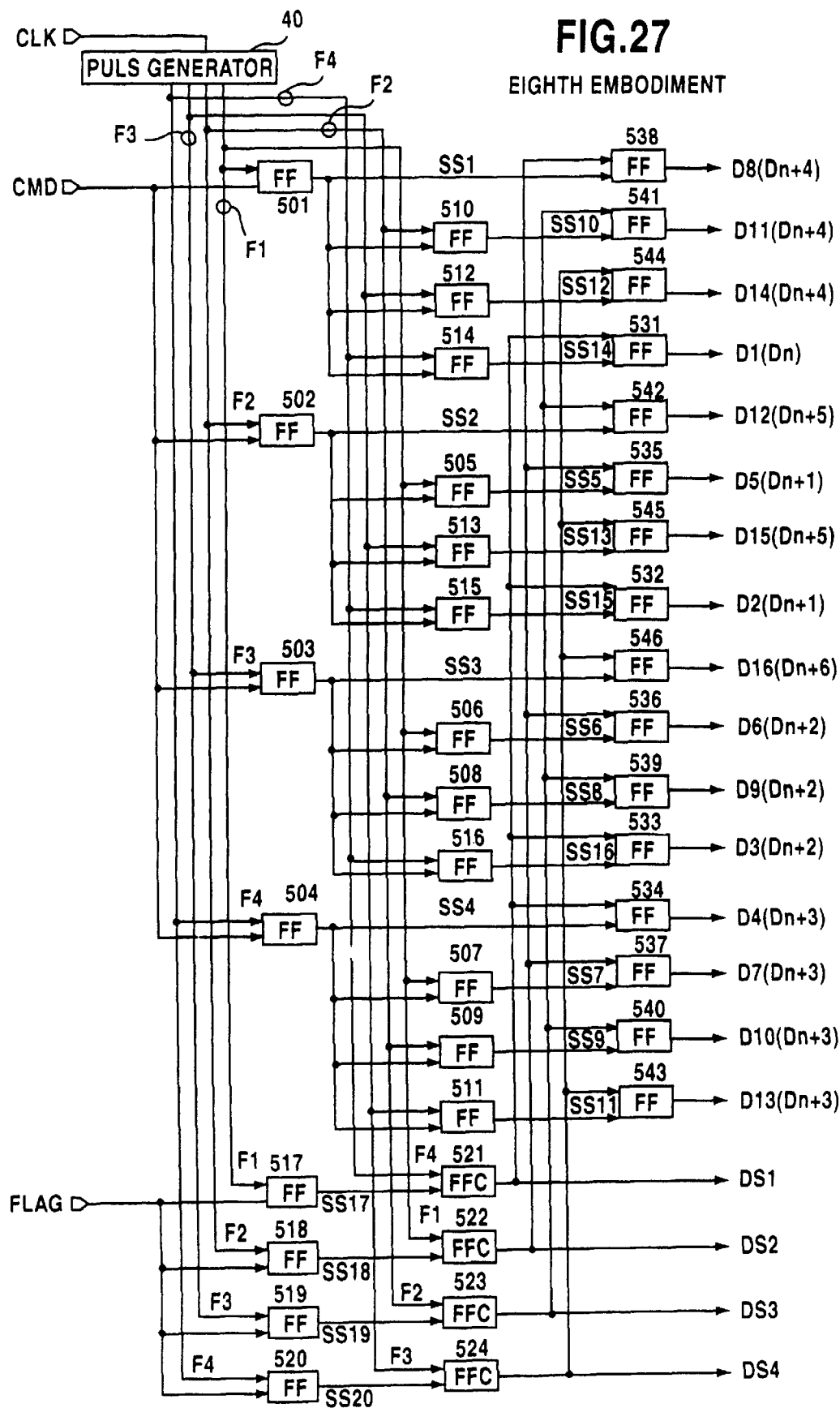
FIG. 27 is a diagram illustrating a serial/parallel converter according to an eighth embodiment.
Figure 28:
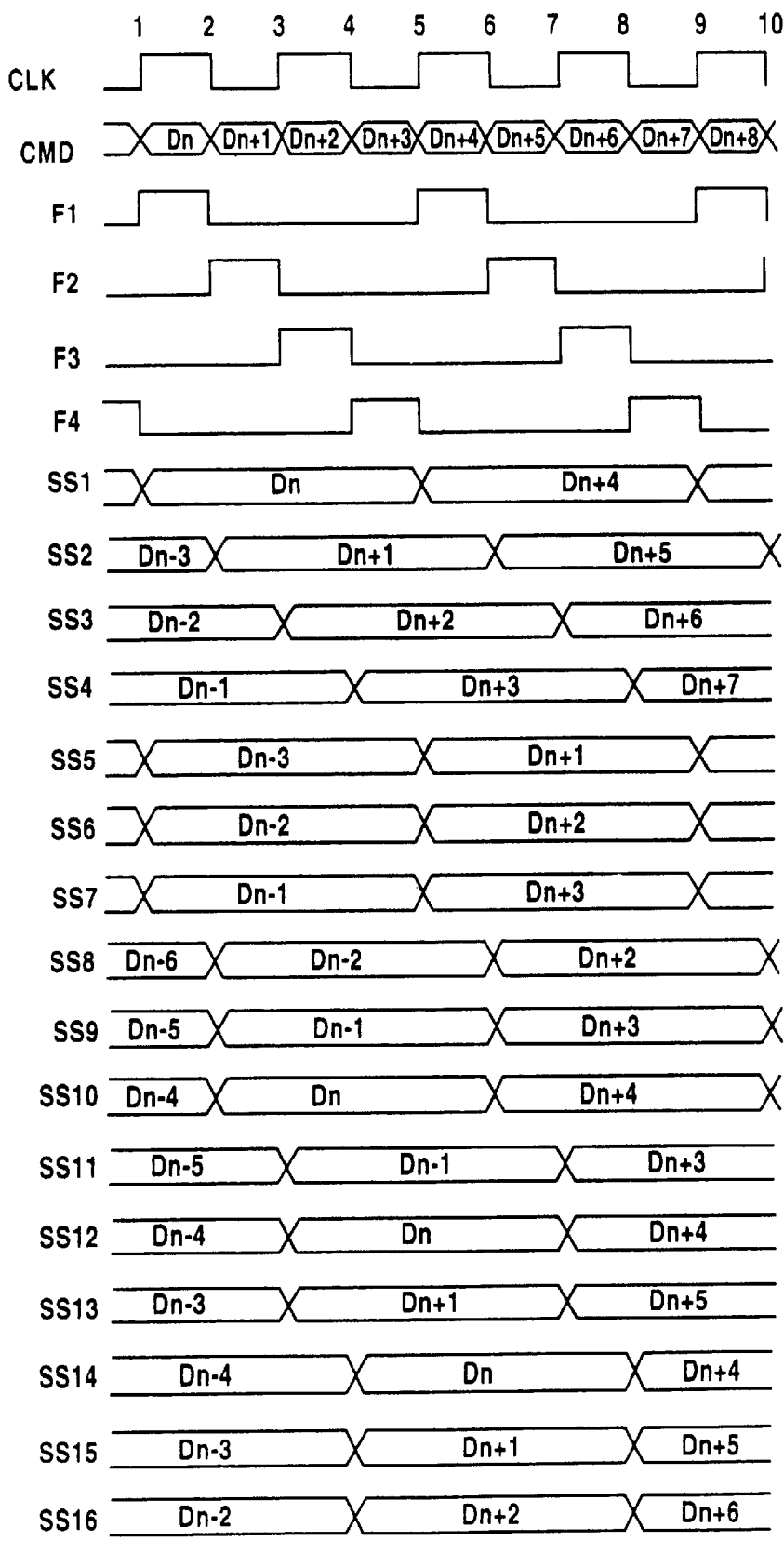
FIG. 28 is a timing chart for the serial/parallel converter in FIG. 27.
Figure 29:
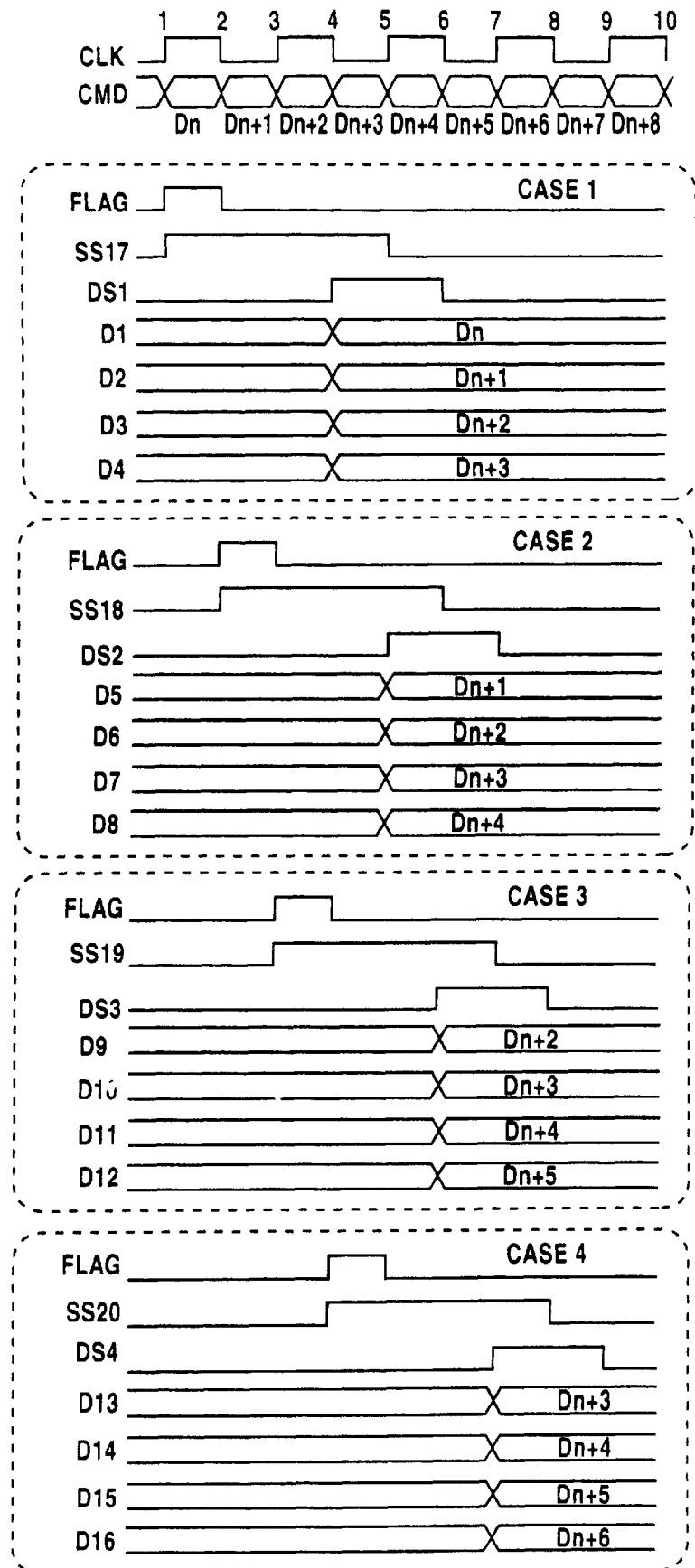
FIG. 29 is a timing chart for the serial/parallel converter in FIG. 27.

FIG. 27 is a diagram illustrating a serial/parallel converter according to an eighth embodiment of the present invention, and FIGS. 28 and 29 are timing charts. In the eighth embodiment, there is a premise that the leading edge of a flag signal FLAG can be synchronized with either the leading edge or the trailing edge of the clock CLK. In other words, the first serial data can be supplied either at the leading edge or at the trailing edge of the clock CLK, and the serial/parallel converter in this embodiment can cope with four timings for the supply of the 4 bits of serial data.

In the eighth embodiment, as is shown in FIG. 29, in case 1, wherein the leading edge of the flag signal FLAG corresponds to the supply of serial data $D_n$ (and the generation of a timing pulse F1), the serial data $D_n$ to $D_{n+3}$ are converted into parallel data. The parallel data D, to $D_{n+3}$ are latched by a first group of flip-flops 531 to 534 at the final stage.

In case 2 wherein the leading edge of the flag signal FLAG corresponds to the supply of serial data $D_{n+1}$ (and the generation of a timing pulse F2), the serial data $D_{n+1}$ to $D_{n+4}$ are converted into parallel data. The parallel data Dn+1 to $D_{n+4}$ are latched by a second group of flip-flops 535 to 538 at the final stage.

In case 3, wherein the leading edge of the flag signal FLAG corresponds to the supply of serial data $D_{n+2}$ (and the generation of a timing pulse F3), the serial data $D_{n+2}$ to $D_{n+5}$ are converted into parallel data. The parallel data $D_{n+2}$ to Dn,s are latched by a third group of flip-flops 539 to 542 at the final stage.

In case 4, wherein the leading edge of the flag signal FLAG corresponds to the supply of serial data $D_{n+3}$ (and the generation of a timing pulse F4), the serial data $D_{n+3}$ to $D_{n+6}$ are converted into parallel data. The parallel data $D_{n+3}$ to $D_{n+6}$ are latched by a fourth group of flip-flops 543 to 546 at the final stage.

In the serial/parallel converter in FIG. 27, the flip-flops 501 to 504 at the first stage latch the serial data in order in response to the timing pulses F1 to F4. The flip-flops at the second stage are sorted into the first group of flip-flops 514, 515 and 516, the second group of flip-flops 505, 506 and 507, the third group of flip-flops 508, 509 and 510, and the fourth group of flip-flops 511, 512 and 513.

The serial data $D_n$ to $D_{n+3}$, which were latched by the first group of flip-flops 514 to 516 at the second stage and the flip-flop 504, are latched by the first group of flip-flops 531 to 534 at the final stage in response to the leading edge of the first data strobe signal DS1. The serial data $D_{n+1}$ to $D_{n+4}$, which were latched by the second group of flip-flops 505 to 507 at the second stage and the flip-flop 501, are latched by the second group of flip-flops 535 to 538 at the final stage in response to the leading edge of the second data strobe signal DS2. The serial data $D_{n+2}$ to $D_{n+5}$, which were latched by the third group of flip-flops 508 to 510 at the second stage and the flip-flop 502, are latched by the third group of flip-flops 539 to 541 at the final stage in response to the leading edge of the third data strobe signal DS3. The serial data $D_{n+3}$ to $D_{n+6}$, which were latched by the fourth group of flip-flops 511 to 513 at the second stage and the flip-flop 503, are latched by the fourth group of flip-flops 543 to 546 at the final stage in response to the leading edge of the fourth data strobe signal DS4.

The processing performed in case 1 will now be described while referring to FIGS. 28 and 29. The serial data $D_n$ of a command signal CMD is latched by the flip-flop 501 in response to the timing pulse F1, which is generated at the leading edge of the clock CLK which is synchronized with the leading edge of the flag signal FLAG. At the same time the flag signal FLAG is latched at the first stage by the first flip-flop 517. Following this, the second data $D_{n+1}$ is latched by the flip-flop 502 in response to the timing pulse F2, which is generated at the trailing edge of the clock CLK. Then, the third data $D_{n+2}$ is latched by the flip-flop 503 in response to the timing pulse F3 generated at the leading edge of the clock CLK.

In response to the timing pulse F4 generated at the trailing edge of the clock CLK, the fourth data $D_{n+3}$ is latched by the flip-flop 504 at the first stage, and the data Dn to $D_{n+2}$ which were latched by the flip-flops 501 to 503 are latched by the first flip-flops 514, 515 and 516 at the second stage. Also, the flag signal FLAG which was latched by the first flip-flop 517 at the first stage is latched by the first flip-flop 521 at the second stage. As a result, the data strobe signal DS1 output by the flip-fop 521 rises after the latch operations have been completed. And in response to the leading edge of the data strobe signal DS1, the data $D_n$ to $D_{n+3}$, which are latched by the first group of flip-flops 514 to 516 at the second stage and the flip-flop 504, are latched by the first group of flip-flops 531 to 534 at the final stage. Therefore, the parallel data $D_n$ to $D_{n+3}$ are generated at the output terminals D1 to D4.

In case 2, in response to the timing pulse F2, the second data $D_{n+1}$ is latched by the flip-flop 502 at the first stage, and the flag signal FLAG is latched by the flip-flop 518 at the first stage. In the same manner, in response to the timing pulse F1, the data $D_{n+1}$ to $D_{n+4}$ are latched by the second group of flip-flops 505 to 507 at the second stage and the flip-flop 501, and the flag signal FLAG latched by the second flip-flop 518 at the first stage is latched by the second flip-flop 522 at the second stage.

Then, in response to the leading edge of the data strobe signal DS2 output by the flip-flop 522, the data $D_n$ to $D_{n+3}$, which are latched by the second group of flip-flops 505 to 507 at the second stage and the flip-flop 501, are latched in parallel by the second group of flip-flops 535 to 538 at the final stage.

The same processing is performed for case 3 and case 4.

The serial/parallel converter in the eighth embodiment is constituted at the first stage by the flip-flops 501 to 504, the four sets of flip-flops at the second stage, and the four sets of flip-flops at the final stage. The data are output in parallel to the first group of flip-flops at the final stage in accordance with the flag signal FLAG, which is synchronized with the timing pulse F1; to the second group of flip-flops at the final stage in accordance with the flag signal FLAG, which is synchronized with the timing pulse F2; to the third group of flip-flops at the final stage in accordance with the flag signal FLAG which is synchronized with the timing pulse F3; and to the fourth group of flip-flops at the final stage in accordance with the flag signal FLAG which is synchronized with the timing pulse F4. Therefore, when the serial data are supplied at either leading edge or the trailing edge of the clock CLK, appropriate data can be output in parallel at an optimal timing in accordance with the flag signal FLAG.

Ninth Embodiment

Figure 30:
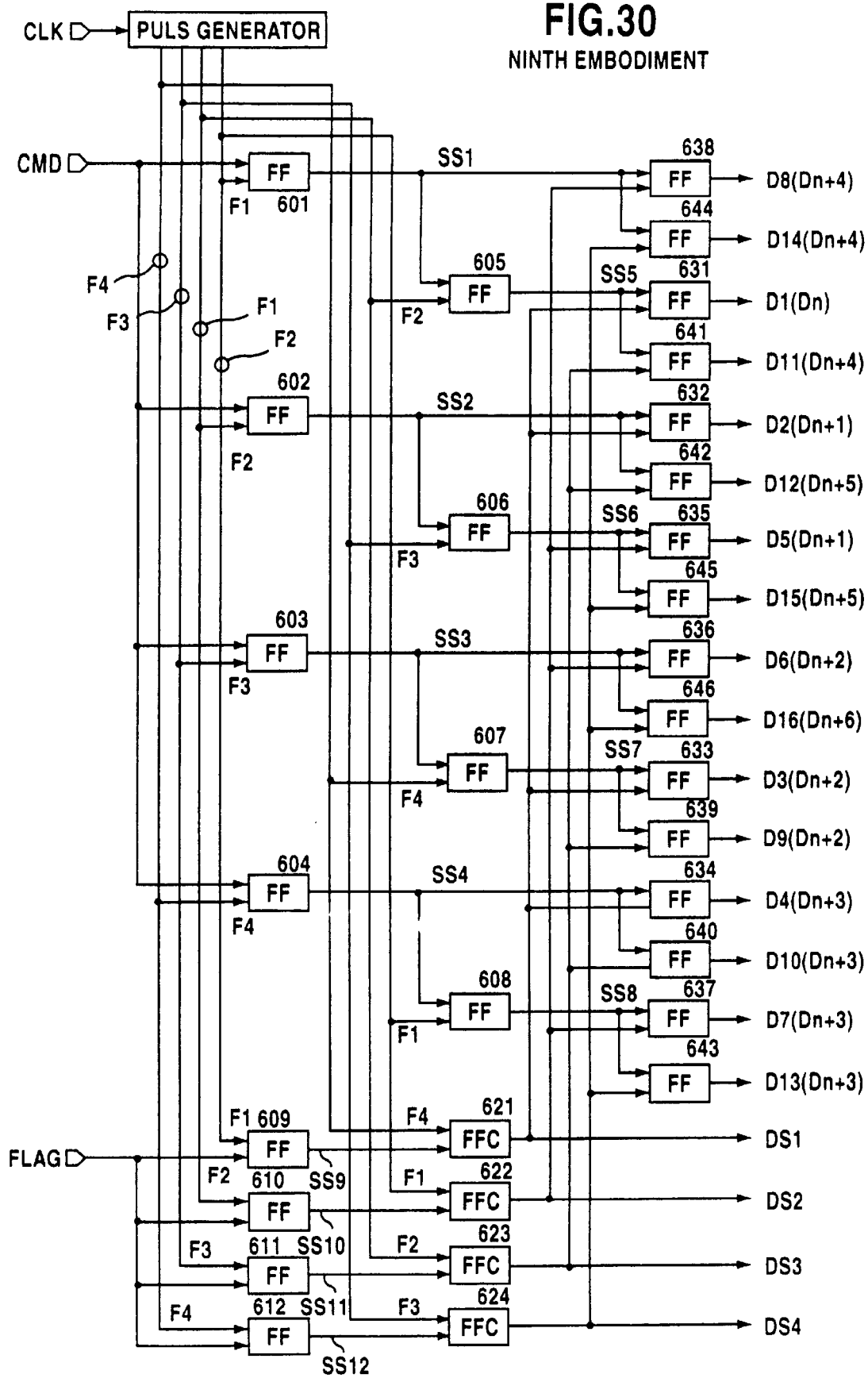
FIG. 30 is a diagram illustrating a serial/parallel converter according to a ninth embodiment.
Figure 31:
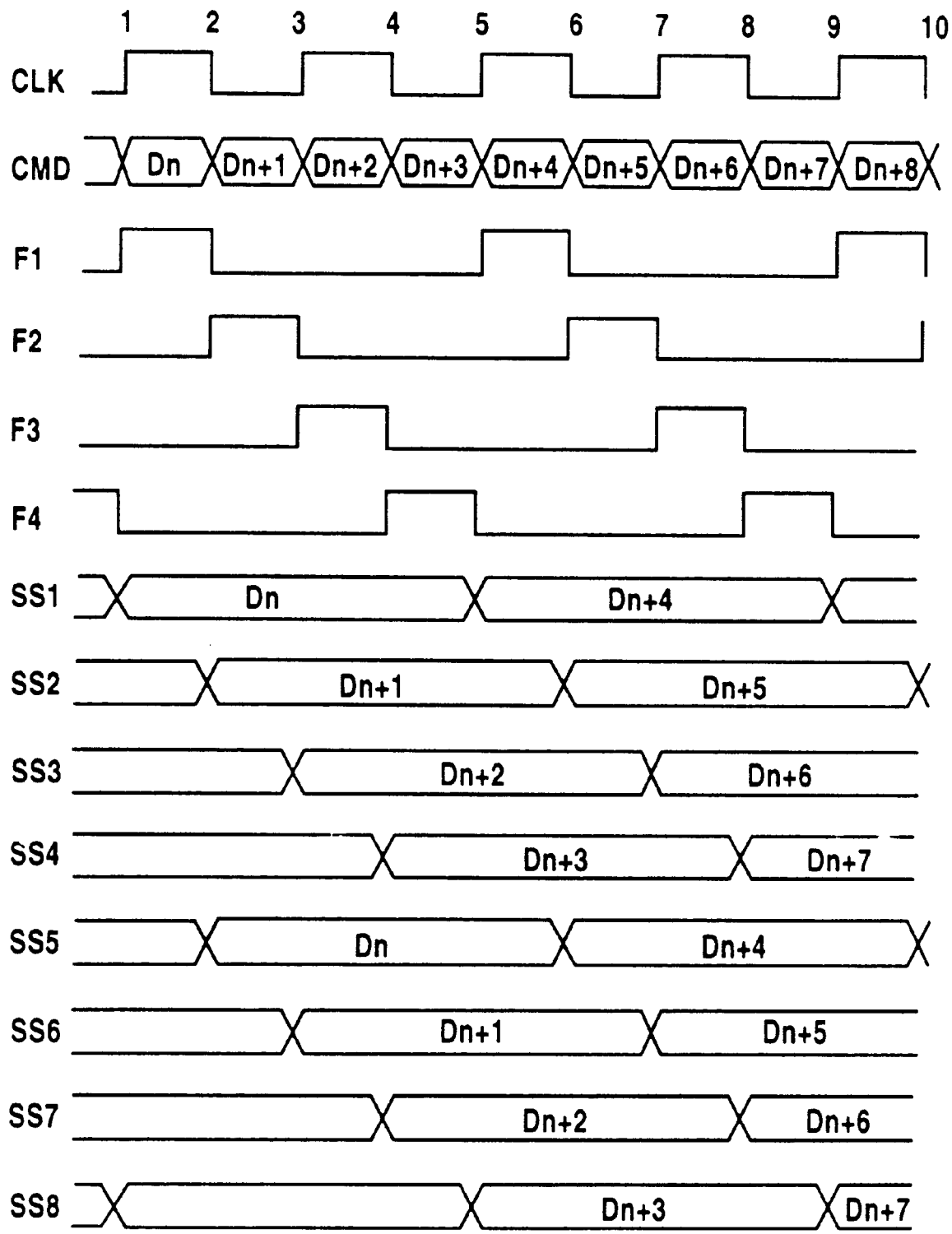
FIG. 31 is a timing chart for the serial/parallel converter in FIG. 30.
Figure 32:
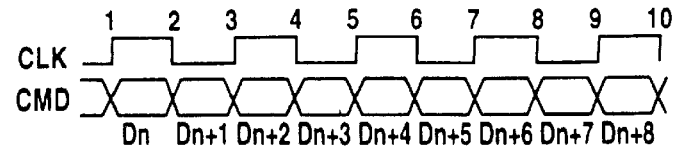
FIG. 32 is a timing chart for the serial/parallel converter in FIG. 30.
Figure 32:
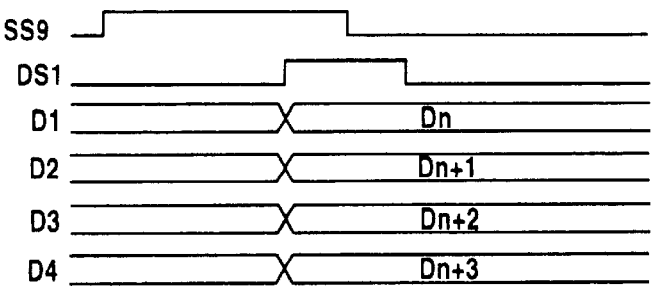
Figure 32:
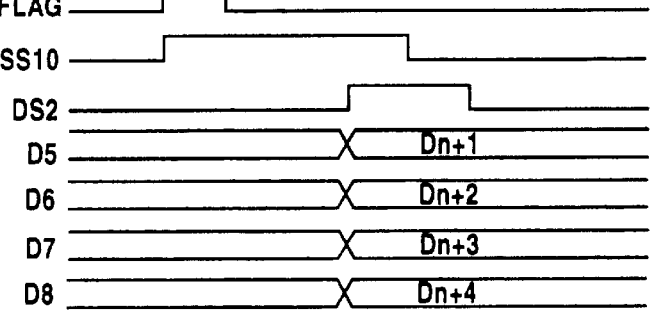
Figure 32:
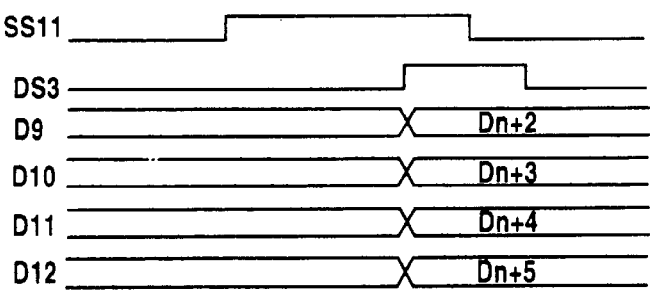
Figure 32:
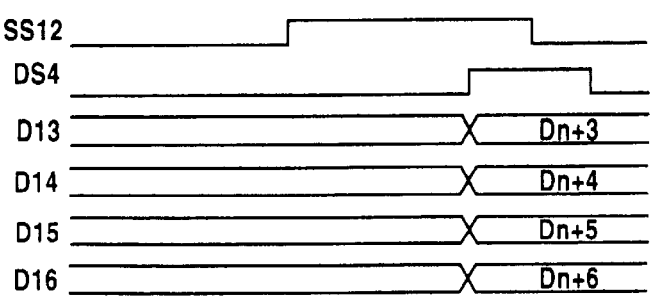

FIG. 30 is a diagram illustrating a serial/parallel converter according to a ninth embodiment of the present invention, and FIGS. 31 and 32 are its timing charts. In this embodiment are provided four sets of the serial/parallel converters employed for the fifth embodiment in FIG. 21, so that four bits of appropriate serial data can be output in parallel even when a flag signal FLAG rises in accordance with either the leading edge or the trailing edge of a clock CLK.

Thus, relative to four cases shown in FIG. 30, combinations of signals output by the four sets of flip-flops at the final stage and parallel data are the same as those in the eighth embodiment (FIG. 29).

In the circuit in FIG. 30, at the first stage flip-flops 601 to 604 and at the second stage flip-flops 605 to 608 are operated in the same manner for four cases. Flip-flops at the final stage are sorted into a first group of flip-flops 631 to 634 (output terminals D1 to D4), a second group of flip-flops 635 to 638 (output terminals D5 to D8), a third group of flip-flops 639 to 642 (output terminals D9 to D12), and a fourth group of flip-flops 643 to 646 (output terminals D13 to D16).

The circuits for latching the flag signal FLAG are the same as those in the eighth embodiment in FIG. 27. That is, the first flag signal latch circuit is constituted by a flip-flop 609 at the first stage, which latches the flag signal FLAG in response to the timing pulse F1, and by a flip-flop 621 at the second stage, which latches the flag signal FLAG in response to the timing pulse F4. The second flag signal latch circuit is constituted by a flip-flop 610 at the first stage, which latches the flag signal FLAG in response to the timing pulse F2, and by a flip-flop 622 at the second stage, which latches the flag signal FLAG in response to the timing pulse F1. The third flag signal latch circuit is constituted by a flip-flop 611 at the first stage, which latches the flag signal FLAG in response to the timing pulse F3, and by a flip-flop 623 at the second stage, which latches the flag signal FLAG in response to the timing pulse F2. The fourth flag signal latch circuit is constituted by a flip-flop 612 at the first stage, which latches the flag signal FLAG in response to the timing pulse F4, and by a flip-flop 624 at the second stage, which latches the flag signal FLAG in response to the timing pulse F1.

The processing performed in case 1 will now be described. First, the serial data $D_n$ is latched by the flip-flop 601 in response to the timing pulse F1, generated at the leading edge of the clock CLK which is synchronized with the leading edge of the flag signal FLAG. At the same time the flag signal FLAG is latched by the flip-flop 609. Following this, in response to the timing pulse F2, the second data $D_{n+1}$ is latched by the flip-flop 602, and the data Dn latched by the flip-flop 601 is latched by the flip-flop 605 at the second stage.

Then, in response to the timing pulse F3, the serial data $D_{n+2}$ is latched by the flip-flop 603. In response to the timing pulse F4, the serial data $D_{n+3}$ is latched by the flip-flop 604, and the data $D_{n+2}$ latched by the flip-flop 603 is latched by the flip-flop 607 at the second stage. Also, the flag signal FLAG latched by the first flip-flop 609 at the first stage is latched by the first flip-flop 621 at the second stage.

In response to the leading edge of the data strobe signal DS1 output by the flip-flop 621, the data $D_n$ to $D_{n+3}$ (outputs SS5, SS2, SS7 and SS4) latched by the flip-flops 605, 602, 607 and 604 are latched in parallel by the first group of flip-flops 631 to 634 at the final stage. Therefore, the parallel data $D_n$ to $D_{n+3}$ are generated at the output terminals D1 to D4.

The same processing is performed for cases 2, 3 and 4.

As is described above, according to the ninth embodiment, four flip-flops are provided for the first and the second stages, and serial data in each of the four cases are latched in parallel by four sets of flip-flops. The parallel data latching timing for each flip-flop is an optimal timing whereat the reception of the flag signal FLAG matches the serial/parallel conversion operation. In addition, even when the serial data are supplied at either the leading edge or the trailing edge of the clock, the appropriate serial data can be output in parallel.

Also in this embodiment, the flip-flops at the final stage can be replaced by NAND gates.

[Pulse generator and flip-flop circuits]

Figure 33:
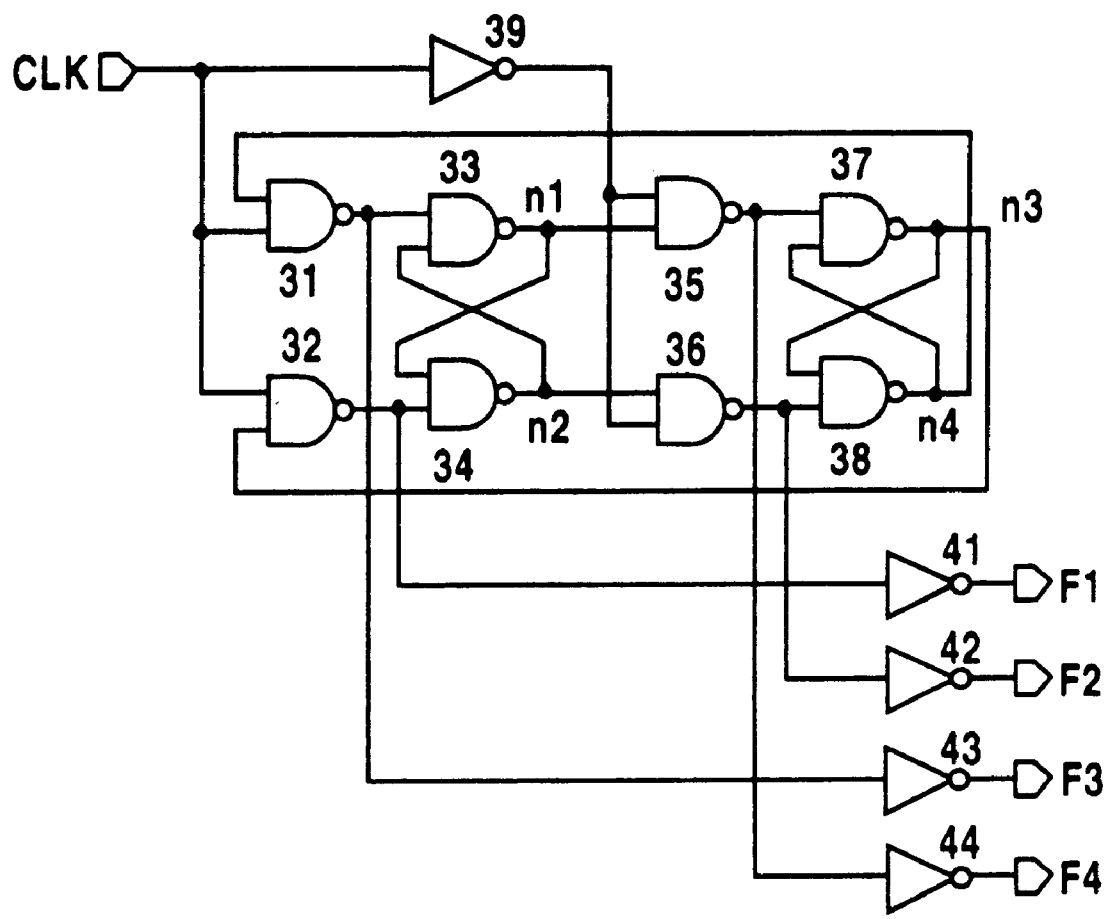
FIG. 33 is a diagram illustrating a pulse generator according to the sixth to the ninth embodiments.

FIG. 33 is a diagram illustrating a pulse generator, which is substantially the same as the one in FIG. 6, for the sixth to the ninth embodiments. The pulse generator comprises a master flip-flop constituted by NAND gates 31 to 34, and a slave flip-flop constituted by NAND gates 35 to 38. The gates 31 and 32, and 35 and 36 latch inverted input in response to the leading edge and the trailing edge of a clock CLK, and invert nodes n1 to n4.

Assume that n1=H, n2=L, n3=H and n4=L, all of which are in the latched state. In this situation, the timing pulses F1, F2 and F3 are at level L, with only F4 being at level H. In synchronization with the leading edge of the clock CLK, the inverted signals of the nodes n3=H and n4=L are latched by the master flip-flop, the output at the gate 32 is driven down to level L, and the timing pulse F1 rises. Since the output of an inverter 39 is at level L, the output of the gate 35 goes to level H, and the timing pulse F4 falls. In addition, since the output of the gate 32 is driven down to level L, the node n2=H and the output of the gate 31 is raised to level H while the output n1 of the gate 33 is driven to level L. Then, in synchronization with the trailing edge of the clock CLK, the inverted signals of the latched signals for the nodes n1=L and n2=H are latched by the slave flip-flop, the output of the gate 36 goes to level L, and the timing pulse F2 rises. At this time, since the clock CLK goes to level L, the output of the gate 32 goes to level H and the timing pulse F1 falls. The latched state of the slave flip-flop is inverted, and n3=L and n4=H.

An operation which is the opposite of the above operation is performed at the leading edge and the trailing edge of the next clock CLK, and the timing pulses F3 and F4 rise in order. As is described above, the timing pulses F1 to F4 rise in order in synchronization with the leading edge and the trailing edge of the clock CLK.

The circuit shown in FIG. 12, for example, can be employed for the flip-flops in the above embodiments.

Figure 34:
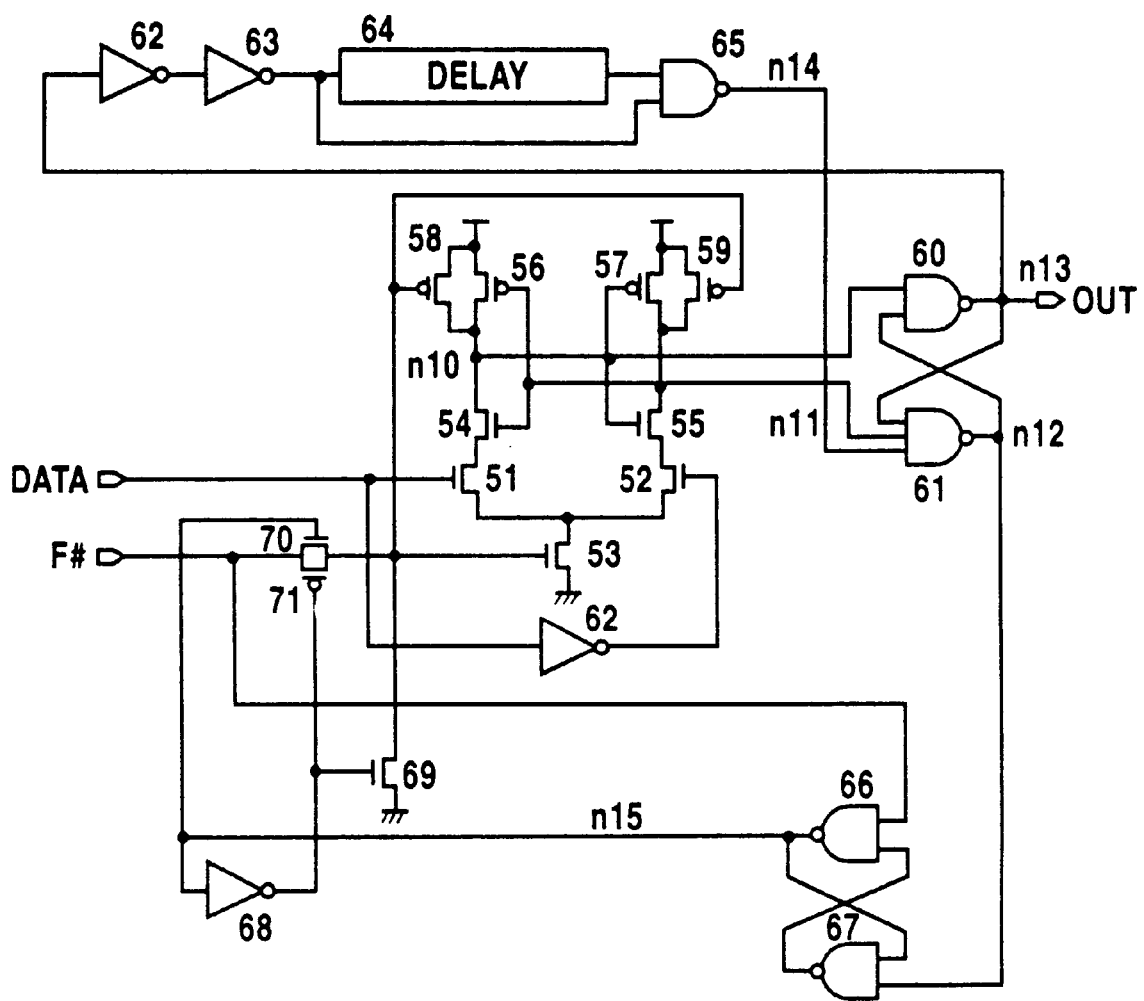
FIG. 34 is a circuit diagram illustrating a flip-flop at a rear stage for latching a flag signal FLAG.

FIG. 34 is a circuit diagram illustrating a flip-flop circuit at the second stage for latching a flag signal FLAG. As previously mentioned, this flip-flop circuit has a self-clear function for latching input data DATA at the leading edge of clock F# and automatically driving output OUT to level L following the elapse of a predetermined period of time. Therefore, the circuit for providing a self-clear function is added to the flip-flop circuit shown in FIG. 12.

The processing performed when, for example, input data DATA is at level H will now be explained. In the initial state, a node n15 is at level H and transfer gates 70 and 71 are conductive. In the same manner as in FIG. 12, in response to the leading edge of the clock F#, a transistor 53 is rendered conductive and a differential circuit constituted by transistors 51 and 52 detects the level H of input data DATA. As a result, node n10 is driven to level L, and accordingly, node n13 latches data at level H, while node n12 latches data at level L.

Because the node n12 is at level L, the output of a gate 67 is raised to level H, and together with the clock F#, which is also at level H, drives output n15 at a gate 66 to level L. As a result, the transfer gates 70 and 71 are closed, the output of an inverter 68 is raised to level H, an N type transistor 69 and P type reset transistors 58 and 59 are rendered conductive, and nodes n10 and n11 go to level H, which is the reset state. However, the latched states of the gates 60 and 61 are maintained.

A circuit constituted by inverters 62 and 63, a delay circuit 64 and a NAND gate 65 changes the node n14 from level H to level L when in the delay circuit 64 a predetermined delay time has elapsed. In response to the change in the node level, the output n12 of the gate 61 is raised to level H. Therefore, the output OUT of the gate 60 is changed to level L because the nodes n10 and n12 are at level H. The self-clearing process is thereafter completed. The latch circuit maintains that condition.

As is described above, the flip-flop circuit having the self-clear function in FIG. 34 latches the data in response to the leading edge of the clock F#, and automatically clears its output OUT following a predetermined period of time.

As is described above, according to the serial/parallel converter of the present invention, the flag signal indicating the start of the serial data can be latched in parallel to the latching operation of the serial data, and the timing for the output of parallel data can be optimized.

In addition, since the serial/parallel converter of the present invention latches serial data in response to a timing when serial data can be supplied, it can precisely convert appropriate serial data into parallel data and output them, regardless of the timing when the serial data are supplied.

What is claimed is:

1. A serial/parallel converter for converting N bits (N is a plural) of serial data, which are supplied in synchronization with a clock from a timing of a flag signal, into parallel data comprises:

a pulse generator for repeatedly generating first to Nth timing pulses serially in synchronization with a clock;

a flag signal latch circuit for latching said flag signal in response to a (2I−1)th (I are all integers of $1 \leq I \leq N/2$) timing pulse and for outputting first to (N/2)th strobe signals corresponding to said flag signal in response to a (2I−2)th (or Nth if I=1) timing pulse;

a first-stage latch circuit for latching first to Nth serial data in response to said first to Nth timing pulses;

N/2 groups of second-stage latch circuits for respectively latching, in response to a (2I−2)th timing pulse, (2I−1)th to (2I−3)th ((N−1)th if I=1) serial data latched by said first-stage latch circuit; and N/2 groups of final-stage gate circuits for respectively outputting in parallel, in response to said first to said (N/2)th strobe signals, (N−1) bits of serial data latched by said second-stage latch circuits as well as Nth serial data latched by said first latch circuit.

2. A serial/parallel converter for converting N bits (N is a plural) of serial data, which are supplied in synchronization with a clock from timing of a flag signal, into parallel data comprises:
- a pulse generator for repeatedly generating first to Nth timing pulses serially in synchronization with a clock;
- a flag signal latch circuit for latching said flag signal in response to a (2I−1)th (I are all integers of $1 \leq I \leq N/2$) timing pulse and for outputting first to (N/2)th strobe signals corresponding to said flag signal in response to a (2I−2)th (or Nth if I=1) timing pulse;
- a first serial data latch circuit for latching first to Nth serial data in response to said first to Nth timing pulses;
- Ith serial data latch circuits for respectively latching (2I−1)th to (2I−2)th serial data in response to (2I−1)th to (2I−2) (I are all integers of $2 \leq I \leq N/2$) timing pulses; and
- first and Ith final-stage gate circuits for outputting in parallel, in response to said first to said (N/2)th strobe signals, N bits of serial data latched by said first and Ith serial data latch circuits.

3. A serial/parallel converter for converting N bits (N is a plural) of serial data, which are supplied in synchronization with a clock from a timing of a flag signal, into parallel data comprising:
- a pulse generator for repeatedly generating first to Nth timing pulses serially in synchronization with a clock;
- a flag signal latch circuit for latching said flag signal in response to an Ith (I are all integers of $1 \leq I \leq N$) timing pulse and for outputting first to Nth strobe signals corresponding to said flag signal in response to an (I−1)th (or Nth if I=1) timing pulse;
- a first-stage latch circuit for latching first to Nth serial data in response to said first to Nth timing pulses;
- N groups of second-stage latch circuits for respectively latching, in response to said Ith timing pulse, Ith to (I−2)th ((N−1)th if I=1 and Nth if I−2) serial data latched by said first-stage latch circuit; and
- N groups of final-stage gate circuits for outputting in parallel, in response to said first to said Nth strobe signals, (N−1) bits of serial data latched by said second-stage latch circuits as well as Nth serial data latched by said first latch circuit.

4. A serial/parallel converter for converting N bits (N is a plural) of serial data, which are supplied in synchronization with a clock from a timing of a flag signal, into parallel data comprising:
- a pulse generator for repeatedly generating first to Nth timing pulses serially in synchronization with a clock;
- a flag signal latch circuit for latching said flag signal in response to a (2M−1)th (M are all integers of $1 \leq M \leq N/2$) timing pulse and for outputting first to (N/2)th strobe signals corresponding to said flag signal in response to a (2M−2)th (or Nth if M=1) timing pulse;
- a first-stage latch circuit for latching a (2M−1)th serial data in response to said (2M−1)th (M is an integer of $1 \leq M \leq N/2$) timing pulse;
- a second-stage latch circuit for latching, in response to a 2Mth timing pulse, said (2M−1)th serial data latched by said first-stage latch circuit as well as a 2Mth serial data; and
- N/2 groups of final-stage gate circuits for outputting in parallel, in response to said first to said (N/2)th strobe signals, N bits of serial data latched by said second-stage latch circuit.

5. A serial/parallel converter for converting N bits (N is a plural) of serial data, which are supplied in synchronization with a clock from a timing of a flag signal, into parallel data comprising:
- a pulse generator for repeatedly generating first to Nth timing pulses serially in synchronization with a clock;
- a flag signal latch circuit for latching said flag signal in response to an Mth (M are all integers of $1 \leq M \leq N$) timing pulse and for outputting first to Nth strobe signals corresponding to said flag signal in response to a (M−1)th (or Nth if M=1) timing pulse;
- first-stage latch circuits for respectively latching an Mth serial data in response to said Mth (M are all integers of $1 \leq M \leq N$) timing pulse;
- a second-stage latch circuit for latching, in response to an (M+1)th (first if M=N) timing pulse, said Mth serial data latched by said first-stage latch circuit; and
- N groups of final-stage gate circuits for outputting in parallel, in response to said first to said Nth strobe signals, N bits of serial data latched by said first-stage and said second-stage latch circuits.

* * * * *